(12) United States Patent
Castle et al.

(10) Patent No.: US 8,645,086 B1
(45) Date of Patent: Feb. 4, 2014

(54) STRESS FUNCTION CALIBRATION METHOD

(75) Inventors: James B. Castle, Saint Charles, MO (US); Sebastian Nervi, Buenos Aires (AR); Randolph B. Hancock, Wildwood, MO (US); Jared Bolin, Millstadt, IL (US)

(73) Assignee: The Boeing Company, Chicago, IL (US)

( * ) Notice: Subject to any disclaimer, the term of this patent is extended or adjusted under 35 U.S.C. 154(b) by 704 days.

(21) Appl. No.: 12/885,441

(22) Filed: Sep. 18, 2010

(51) Int. Cl.
*G01L 1/00* (2006.01)
(52) U.S. Cl.
USPC .......................................................... 702/42
(58) Field of Classification Search
USPC .......................................................... 702/42
See application file for complete search history.

(56) References Cited

U.S. PATENT DOCUMENTS

| | | | |
|---|---|---|---|
| 5,796,617 A * | 8/1998 | St. Ville | 700/98 |
| 6,532,421 B2 * | 3/2003 | Miwa | 702/34 |
| 6,934,642 B2 | 8/2005 | Berry | |
| 7,082,338 B1 | 7/2006 | Chen | |

* cited by examiner

*Primary Examiner* — Aditya Bhat

(57) ABSTRACT

A method of predicting distortion in a workpiece may include measuring residual stress induced in a coupon surface of a plate coupon by a selected manufacturing operation. The induced residual stress measurements may be fitted to a curve shape function. A moment coefficient may be calculated based upon the fitted induced residual stress measurements. The moment coefficient may be used to calibrate a stress function and corresponding stress magnitude. The calibrated stress function may be applied to a model of the workpiece such that the distortion of the workpiece may be predicted.

20 Claims, 16 Drawing Sheets

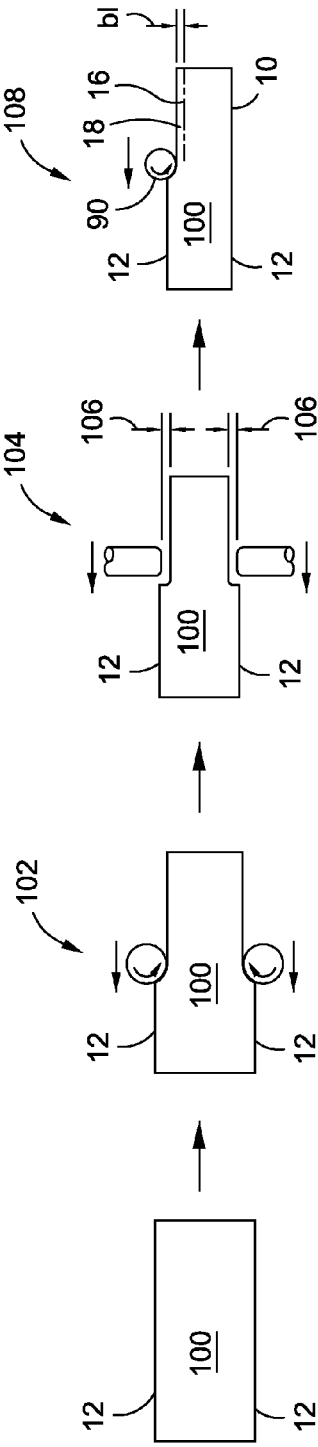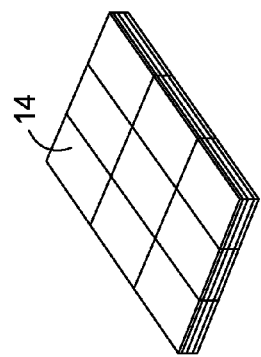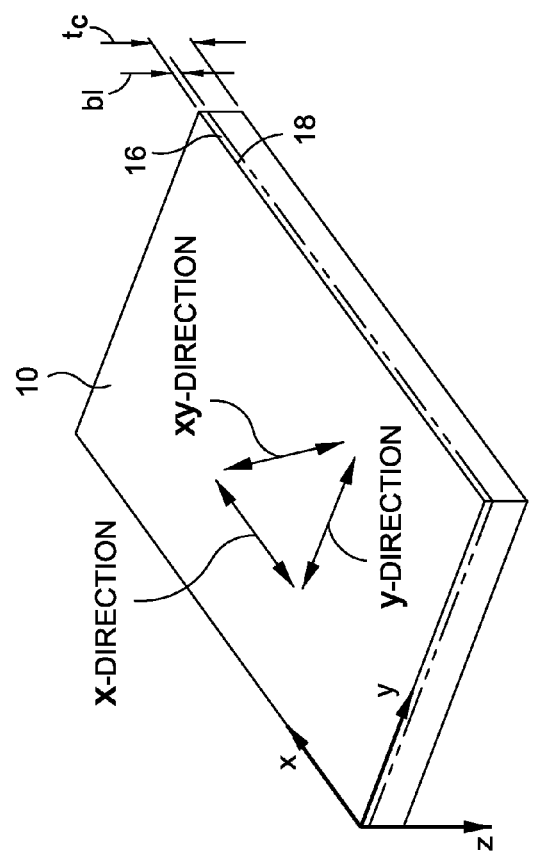

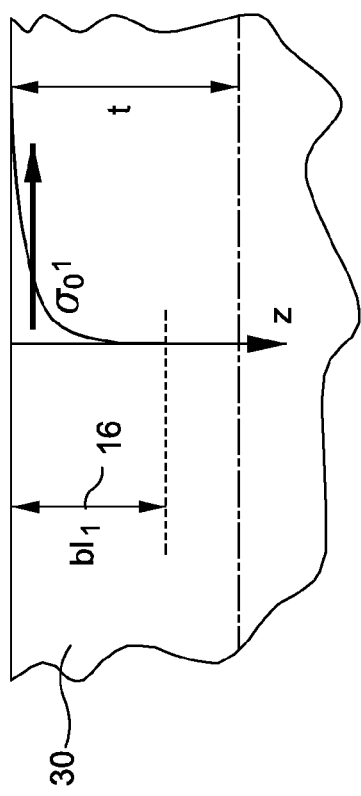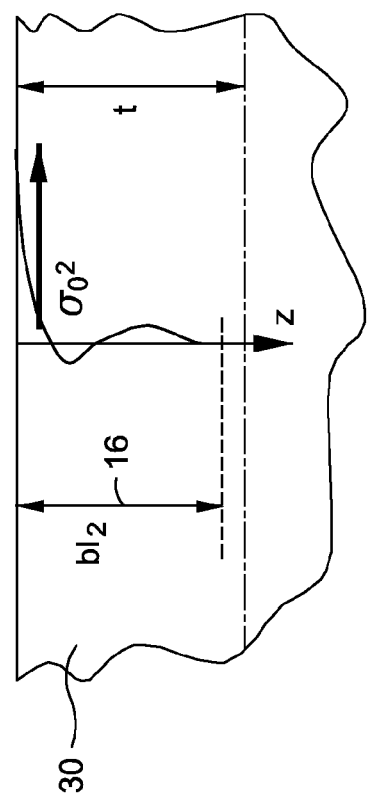
FIG. 3A
FIG. 3B

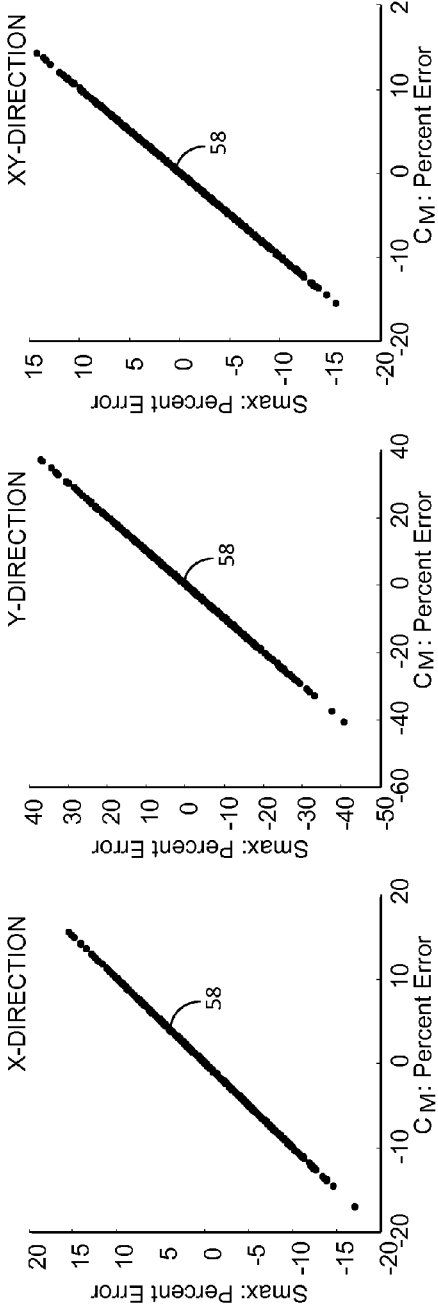
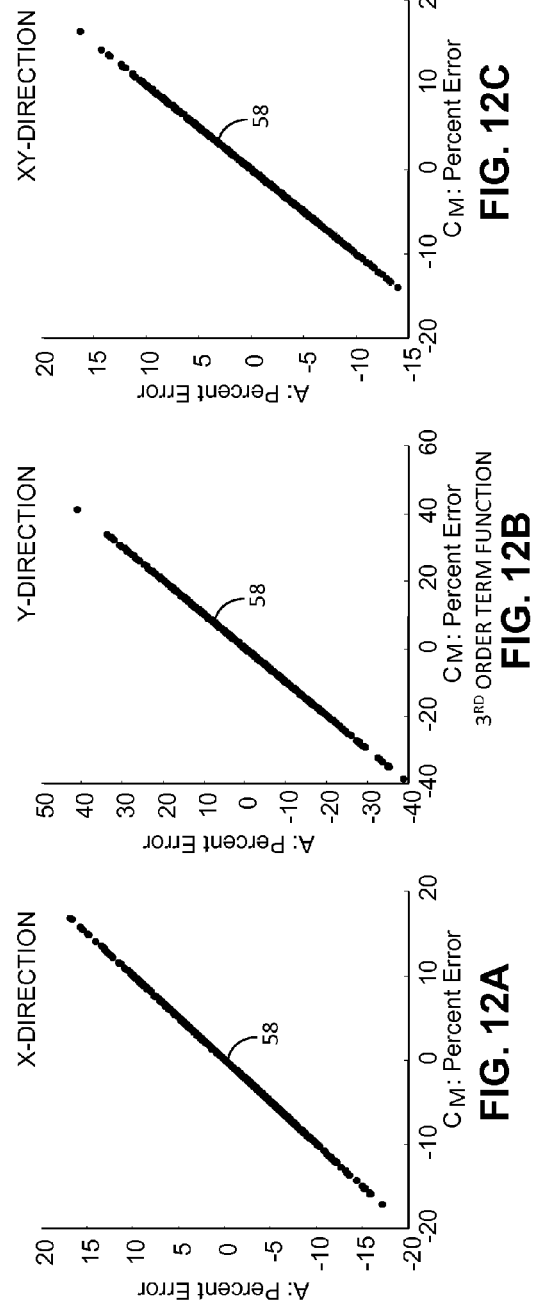
FIG. 11A, FIG. 11B, FIG. 11C, FIG. 12A, FIG. 12B, FIG. 12C

Error in C_F Computation

| Fixed Depth (in) | Step Function | | | 3rd Order Term Function | | |
|---|---|---|---|---|---|---|
| | x | y | xy | x | y | xy |
| 0.0001 | 0.3% | 0.3% | 0.8% | 0.4% | 0.5% | 0.9% |
| 0.0004 | -0.3% | -0.3% | 0.2% | 0.2% | 0.2% | 0.7% |
| 0.0007 | -0.9% | -0.9% | -0.4% | -0.1% | 0.0% | 0.4% |
| 0.0010 | -1.5% | -1.5% | -1.0% | -0.3% | -0.3% | 0.2% |
| 0.0013 | -2.2% | -2.1% | -1.7% | -0.5% | -0.5% | -0.1% |
| 0.0016 | -2.8% | -2.7% | -2.3% | -0.8% | -0.8% | -0.3% |
| 0.0019 | -3.4% | -3.4% | -2.9% | -1.0% | -1.0% | -0.6% |
| 0.0022 | -4.1% | -4.0% | -3.6% | -1.3% | -1.2% | -0.8% |

FIG. 17

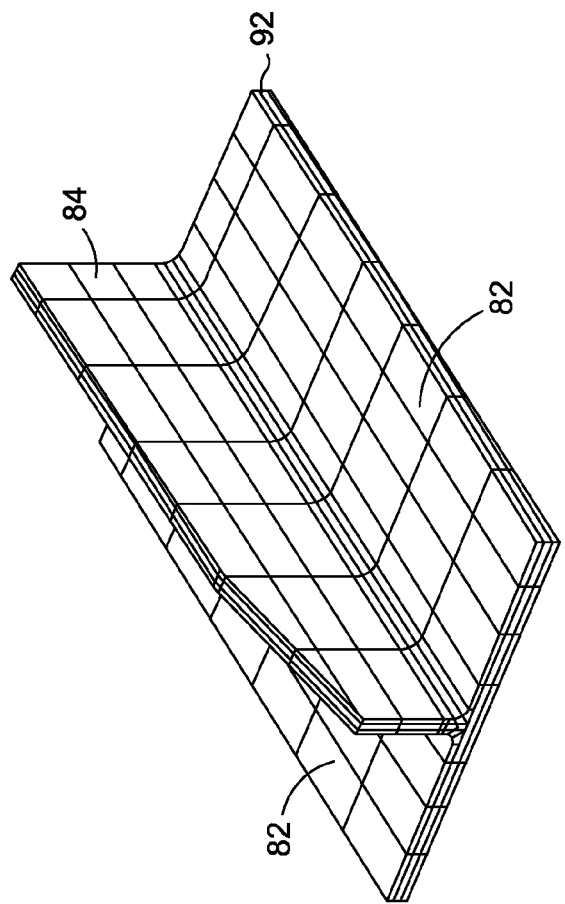
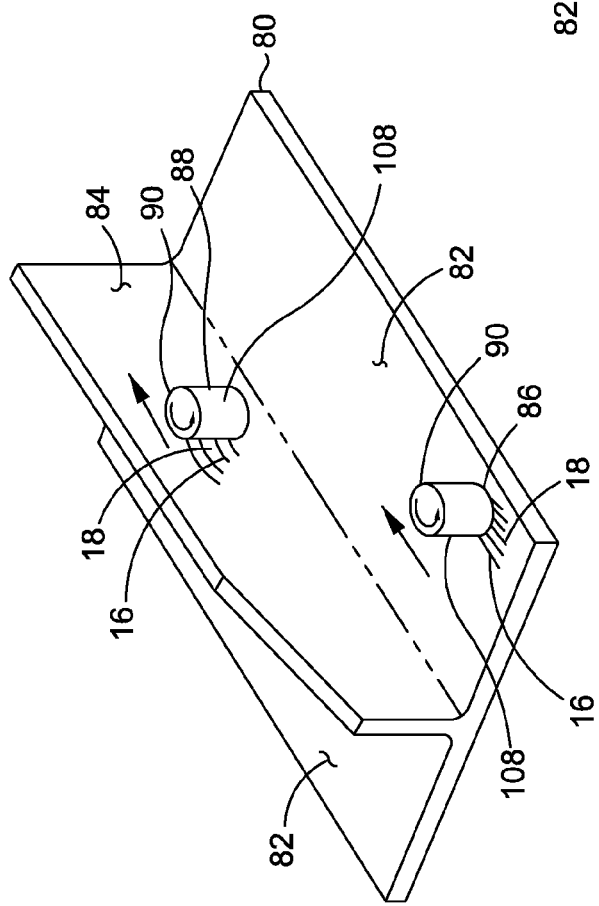
FIG. 18B
FIG. 18A

STRESS FUNCTION CALIBRATION METHOD

STATEMENT RE: FEDERALLY SPONSORED RESEARCH/DEVELOPMENT

This invention was made with Government support under United States Air Force Cooperative Agreement No. FA8650-07-2-5203. The Government has certain rights in this invention.

CROSS-REFERENCE TO RELATED APPLICATIONS (Not Applicable)

FIELD

The present disclosure relates generally to residual stress induced in a workpiece as a result of a manufacturing operation performed on the workpiece.

BACKGROUND

Residual stress may be defined as stress that resides or remains within a workpiece following the application of one or more manufacturing operations. Manufacturing operations that induce residual stress in a workpiece may include any process where heat, pressure and/or energy are applied to the workpiece. For example, a machining operation may be performed on a metallic (e.g., aluminum, titanium) workpiece in order to shape the workpiece into its intended configuration. During the machining operation, a rotating cutting tool may be placed in direct contact with the workpiece. The cutting tool is moved along the workpiece surface at a desired feed rate to remove layers of the metallic material. The removal of metallic material by the cutting tool causes local yielding and plastic strain in the outer surface layer of the workpiece inducing residual stress in the machined surface.

The magnitude of the machining-induced residual stress is typically highest at the outer surface of the workpiece and diminishes to zero within a relatively shallow depth. In addition, depending upon the manufacturing operation, the residual stress may be compressive, tensile or a combination of compressive and tensile through the thickness of the residual stress layer. Residual stress that is predominantly compressive may enhance the strength and fatigue properties of the workpiece. Post-machining operations such as shot-peening may be performed on a machined surface to impart compressive residual stress into the outer layer to enhance the fatigue strength and thereby extend the fatigue life of a workpiece. Residual stress that is predominantly tensile is generally detrimental to fatigue strength and may shorten the fatigue life of the workpiece.

Distortion is another undesirable effect of residual stress that may occur in a workpiece following a manufacturing operation. Distortion may be characterized as in-plane distortion or out-of-plane distortion. In-plane distortion includes expansion or contraction of the workpiece along a direction parallel to the plane of the workpiece surface. Out-of-plane distortion includes displacement in the form of twisting and/or bending of the workpiece surface along a direction perpendicular to the surface.

Although the depth of machining-induced residual stress in a workpiece is typically shallow (e.g., 0.004 to 0.020 inch), out-of-plane distortion has a more noticeable effect on relatively thin metallic cross-sections that are less resistant to bending as compared to thicker cross-sections that are more resistant to bending. Unfortunately, moderate distortion may result in expensive and time-consuming inspection and reworking to bring the workpiece within design tolerances. Excessive distortion may lead to scrapping of the workpiece and fabrication of a replacement.

The parameters of the machining operation have an effect on the magnitude, type (i.e., compressive or tensile in the surface) and through-thickness distribution of residual stress in a workpiece. For example, during high-speed machining, a cutting tool may be rotated at relatively high speed and/or the cutting tool may be driven into the workpiece at a relatively high feed rate which, depending on the machining parameters, may result in non-optimal machining of the workpiece. Non-optimal machining is believed to increase residual stress and distortion in a workpiece as compared to more conventional machining. Other machining parameters that may affect the magnitude and orientation of machining-induced residual stress include, without limitation, the geometric parameters of the cutting tool, whether the end of the cutting tool is used as the cutting surface to remove material or whether the sides of the cutting tool are used as the cutting surface, and the sharpness of the cutting tool. The composition or alloy of the workpiece material may also affect the character of the residual stress.

The known methods for predicting residual stress in a workpiece generally include performing a finite element analysis by applying an estimate of a predicted residual stress to a finite element model of the workpiece. The predicted residual stress is an estimate of the residual stress that may occur in the workpiece as a result of the manufacturing operation. Unfortunately, current systems and methods of estimating residual stress are generally inadequate. Furthermore, current methods of verifying the accuracy of the estimated residual stress due to a manufacturing operation are time-consuming. For example, current methods of verifying residual stress estimates require measuring residual stress in the machined workpiece and comparing the measurements to the predictions from the model solved using the finite element method. The parameters of the manufacturing operation are then adjusted or the workpiece may be redesigned in an attempt to reduce or eliminate the residual stress and distortion in the workpiece. The process is repeated in an iterative manner until the residual stress in the physical workpiece falls within acceptable limits. Unfortunately, the process of iteratively adjusting the machining parameters, fabricating a new workpiece, measuring the residual stress in the new workpiece, and then re-adjusting the machining parameters is time consuming and costly.

As can be seen, there exists a need in the art for a method of validating predictions of residual stress that may occur in a workpiece resulting from a selected manufacturing operation without fabricating the workpiece and measuring the residual stress.

BRIEF SUMMARY

The above-described needs associated with residual stress predictions are specifically addressed by the present disclosure which, in an embodiment, provides a method of predicting workpiece distortion resulting from a selected manufacturing operation. The embodiment comprises calculating a moment coefficient representative of residual stress induced in a plate coupon by a selected manufacturing operation. The method may further include calibrating a stress function to the moment coefficient and applying the calibrated stress function to a model of the workpiece. The method may also include computing predicted distortion of the workpiece resulting from application of the calibrated stress function to the workpiece model.

In a further embodiment, the present disclosure provides a method of predicting distortion in a workpiece processed using a selected manufacturing operation. The method may include applying the selected manufacturing operation to a coupon surface of a plate coupon and measuring residual stress induced in the coupon surface. The induced residual stress measurements may be fitted to a curve shape function and a moment coefficient of the fitted induced residual stress measurements may be calculated. The method may also include calibrating a stress function to the moment coefficient by fixing a depth term of the stress function to be less than the depth at which the induced residual stress measurements diminish to zero in the plate coupon. The calibration of the stress function may also include equating a moment of the stress function to the moment coefficient and solving for a stress magnitude term of the stress function. The calibrated stress function may be applied to a model of the workpiece at the stress magnitude. The method may further include computing at least one of predicted distortion and predicted residual stress in the workpiece resulting from application of the calibrated stress function to the model.

The present disclosure further includes a processor-based system for predicting distortion in a workpiece manufactured using a selected manufacturing operation. The processor-based system may include a coefficient calculator for calculating a moment coefficient representative of residual stress induced in a plate coupon by the selected manufacturing operation. The processor-based system may additionally include a stress function calibrator for calibrating a stress function to the moment coefficient. A stress function applicator may be included with the processor-based system for applying the calibrated stress function to a model of the workpiece. A distortion predictor may be included with the processor-based system for computing at least one of predicted distortion and predicted residual stress in the workpiece resulting from application of the calibrated stress function to the workpiece model.

The features, functions and advantages that have been discussed can be achieved independently in various embodiments of the present disclosure or may be combined in yet other embodiments, further details of which can be seen with reference to the following description and drawings below.

BRIEF DESCRIPTION OF THE DRAWINGS

These and other features of the present disclosure will become more apparent upon reference to the drawings wherein like numerals refer to like parts throughout and wherein:

FIG. 1A is a schematic illustration of plate stock material as may be used in a sequence of forming a plate coupon;

FIG. 1B is a schematic illustration of a rough machining operation applied to opposing surfaces of the plate stock for equalizing residual stress in the opposing surfaces;

FIG. 1C is a schematic illustration of an electrochemical milling operation applied to both of the opposing surfaces of the plate stock to remove residual stress in the opposing surfaces;

FIG. 1D is a schematic illustration of the application of a selected machining operation to one of the opposing surfaces of the plate stock to form a plate coupon having residual stress uniformly induced along a coupon surface;

FIG. 2 is a perspective illustration of the plate coupon and further illustrating the residual stress induced in a layer of the coupon surface by the selected machining operation;

FIG. 2A is a perspective illustration of a finite element model of the plate coupon;

FIG. 3A is a cross-sectional schematic illustration of a first residual stress distribution in a semi-infinite plate;

FIG. 3B is a cross-sectional schematic illustration of a second residual stress distribution in a semi-infinite plate;

FIG. 11A is an illustration of a graph of moment coefficient relative error versus stress magnitude relative error of a step function calibrated to the moment coefficient and wherein the moment coefficient is computed with random noise or error artificially added to the induced residual stress measurements for the x-direction;

FIG. 11B is an illustration of a graph of moment coefficient relative error versus stress magnitude relative error of a step function calibrated to the moment coefficient for the y-direction;

FIG. 11C is an illustration of a graph of moment coefficient relative error versus stress magnitude relative error of a step function calibrated to the moment coefficient for the xy-direction;

FIG. 12A is an illustration of a graph of moment coefficient relative error versus stress magnitude relative error of a $3^{rd}$ order term function calibrated to the moment coefficient for the x-direction;

FIG. 12B is an illustration of a graph of moment coefficient relative error versus stress magnitude relative error of a $3^{rd}$ order term function calibrated to the moment coefficient for the y-direction;

FIG. 12C is an illustration of a graph of moment coefficient relative error versus stress magnitude relative error of a $3^{rd}$ order term function calibrated to the moment coefficient for the xy-direction;

FIG. 17 is a table of depths and corresponding relative error between a force coefficient and the resultant of the actual residual stress distribution;

FIG. 18A is a perspective illustration of a workpiece for which distortion and/or residual stress may be predicted;

FIG. 18B is a perspective illustration of a finite element model of the workpiece of FIG. 18A to which the stress function may be applied for predicting distortion and/or residual stress;

DETAILED DESCRIPTION

Figure 4B:
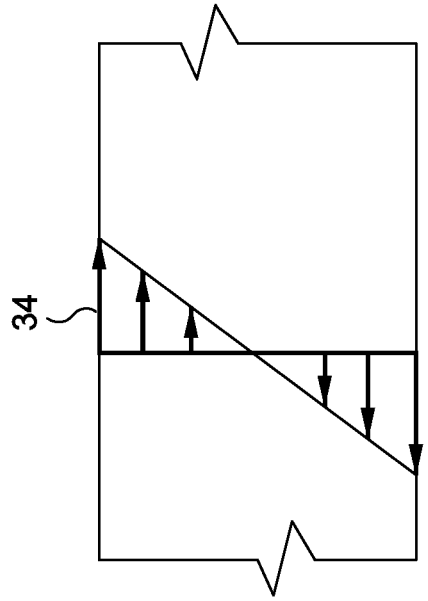
FIG. 4B is a schematic illustration of a linear plate bending function comprised of a gradient of tensile residual stress and compressive residual stress.

Referring now to the drawings wherein the showings are for purposes of illustrating preferred and various embodiments of the disclosure, shown in FIGS. 1A-1D is a schematic illustration of a sequence of operations for fabricating a plate coupon 10 (FIG. 2) from plate stock 100 (FIGS. 1A-1D). A selected manufacturing operation 108 (FIG. 1D) may be performed on one of opposing surfaces 12 of the plate coupon 10. In an embodiment, the selected manufacturing operation 108 may comprise a machining operation using a rotary cutting tool 90 as shown in FIG. 1D. The selected manufacturing operation 108 may induce residual stress 18 along the coupon surface 12 as shown in FIG. 1D and FIG. 2. The induced residual stress 18 may be measured in each one of an x-direction, a y-direction and an xy-direction (FIG. 2). Measurements of induced residual stress 18 may be performed by any suitable technique including, but not limited to, x-ray diffraction. The induced residual stress measurements 50 (FIG. 9) may be fitted to a curve shape function 54 (i.e., a shape approximating curve) as shown in FIG. 9.

Figure 9:
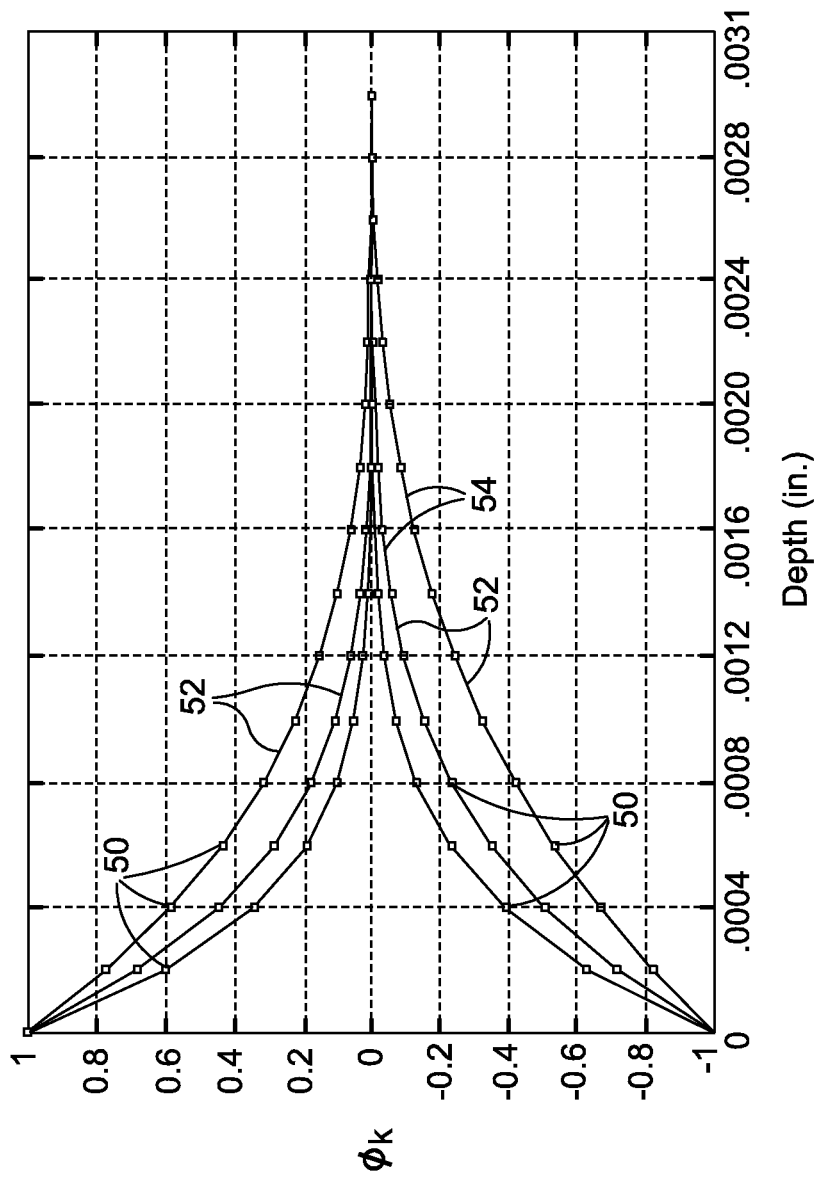
FIG. 9 is an illustration of a curve shape function comprising a least squares polynomial approximation of residual stress measurements induced in the coupon surface by the selected manufacturing operation.

As described in greater detail below, a moment coefficient $C_M$ may be calculated for each one of the x-direction, y-direction and xy-direction (FIG. 2) based on the fitted induced residual stress measurements 52 (FIG. 9). The moment coefficient C may be used to calibrate any suitable stress function 60, without limitation, such as the step function and the $3^{rd}$ order term function respectively illustrated in FIGS. 13 and 15. The stress function 60 may be applied to a finite element model 92 (FIG. 18B) of a workpiece 80 (FIG. 18A) for predicting distortion and/or residual stress in the workpiece 80 resulting from the application of the selected manufacturing operation 108 (FIG. 1D). The selected manufacturing operation 108 may be altered based upon the predicted distortion or predicted residual stress in the workpiece 80. Alternatively, a different manufacturing operation may be performed on the workpiece 80 to minimize the residual stress magnitude in the workpiece 80 and/or to induce the formation of residual stresses that are predominantly compressive to enhance fatigue life and minimize crack growth.

Referring briefly to FIGS. 3A-3B, shown are schematic illustrations of a first residual stress distribution $\sigma_0^1$ and a second residual stress distribution $\sigma_0^2$ in a semi-infinite plate 30 having a finite depth or thickness and infinite length and/or width. The residual stress distributions $\sigma_0^1$, $\sigma_0^2$ illustrated in FIGS. 3A-3B are non-limiting examples of a variety of alternative residual stress distributions that may result from the performance of one or more different manufacturing operations on a surface 12 (FIGS. 1A-1D). Such manufacturing operations may include any process, without limitation, in which energy such as force and/or heat is applied to an object.

For purposes of the present disclosure, the selected manufacturing operation 108 (FIG. 1D) is described as a machining operation wherein a rotary cutting tool 90 (FIG. 1D) is applied to a surface 12 of a metallic plate coupon 10 (FIG. 2) or a metallic workpiece 80 (FIG. 18A) to mechanically remove material. The material of the plate coupon 10 and workpiece 80 may be comprised of any isotropic metallic or non-metallic material or combination thereof, without limitation. The process of mechanically removing material may result in local plastic yielding of the material as the material is cut by the cutting tool 90. Such local yielding may result in the embedding of permanent inelastic strains or eigenstrains within a relatively shallow layer (e.g., 0.020 inch) of the material below the surface 12 (FIGS. 1A-1D). To preserve equilibrium of forces within the object, residual plastic strain may develop within the material resulting in the formation of a residual stress distribution within the shallow residual stress layer 16 as illustrated in FIGS. 3A-3B.

The present disclosure is based on the premise that distortion resulting from machining-induced residual stress 18 (FIG. 2) can be determined from the resultant or integral average of the through-thickness residual strain distribution. Based upon the foregoing, localized variations in strain distribution are ignored and any function that represents through-thickness residual strain distribution in an object can be used to represent residual strain provided that: (1) the resultant of the function has the same magnitude (i.e., is statically equivalent) to the actual (e.g., measured) residual strain and, (2) the depth over which the residual stress is integrated is greater than the depth at which the residual stress diminishes to zero.

In the semi-infinite plate 30 illustrated in FIGS. 3A-3B, residual strain within the semi-infinite plate 30 can be interchanged with residual stress because the distribution of residual strain and residual stress will equilibrate over the infinite length and width of the plate 30. In this regard, the resultant of the integral average of the through-thickness residual strain distribution may be determined by using EQ-10 below which is interpreted as the integral equation for defining the resultant force $C_F$ of the residual stress distribution at a given depth:

$$\int_0^t \sigma_0 \, dz = C_F \quad \text{(EQ-10)}$$

wherein $\sigma_0$ represents the residual stress distribution, z represents the thickness direction, and t represents the depth along which the residual stress is integrated. Likewise, EQ-20 below is interpreted as the integral equation for defining the resultant moment $C_M$ of the residual stress distribution at a given depth:

$$\int_0^t \sigma_0 \left(z - \frac{t}{2}\right) dz = C_M \quad \text{(EQ-20)}$$

In FIGS. 3A and 3B, shown are two different residual stress distributions $\sigma_0^1$ and $\sigma_0^2$ which respectively diminish to zero at $bl_1$ and $bl_2$. In FIG. 3A, it can be seen that the residual stress distributions $\sigma_0^1$ is tensile in nature with the greatest magnitude at the surface 12 (FIGS. 1A-1D) and decaying exponentially to zero at $bl_1$. In contrast, FIG. 3B illustrates a residual stress distribution $\sigma_0^2$ that is a combination of tensile and compressive and which extends to a greater depth $bl_2$ relative to the depth $bl_1$ in FIG. 3A. It can also be seen in FIGS. 3A-3B that the depth t is greater than the maximum of $bl_1$ and $bl_2$ such that the magnitude of the resultant force of the stress distributions $\sigma_0^1$ and $\sigma_0^2$ will be substantially equivalent for any depth t that is greater than the maximum of $bl_1$ and $bl_2$ as illustrated below in EQ-30. Likewise, the magnitude of the resultant moment of the stress distributions $\sigma_0^1$ and $\sigma_0^2$ will be substantially equivalent for any depth t that is greater than the maximum of $bl_1$ and $bl_2$ as illustrated below in EQ-40.

$$\int_0^t \sigma_0^1 \, dz = \int_0^t \sigma_0^2 \, dz = C_F \quad \text{(EQ-30)}$$

$$\int_0^t \sigma_0^1 \left(z - \frac{t}{2}\right) dz = \int_0^t \sigma_0^2 \left(z - \frac{t}{2}\right) dz = C_M \quad \text{(EQ-40)}$$

Figure 4A:
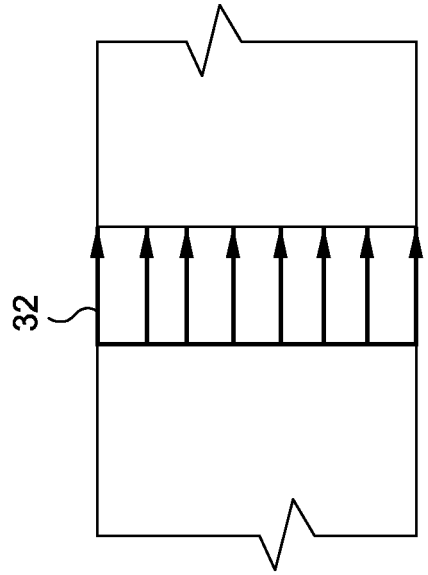
FIG. 4A is a schematic illustration of a linear plate extension function comprised of either tensile residual stress or compressive residual stress.
Figure 5B:
FIG. 5B is a schematic illustration of out-of-plane bending of a plate as a result of the application of the linear plate bending function.
Figure 5A:
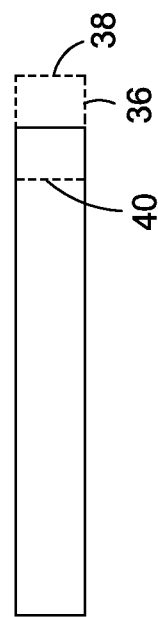
FIG. 5A is a schematic illustration of in-plane extension or contraction of a plate as a result of the application of the linear plate extension function.

Referring briefly to FIGS. 4A-5B, shown are linear, through-thickness stress functions 32, 34 in FIGS. 4A-4B and the respective distortions 36 of arbitrary plates subjected to the stress functions 32, 34 as shown in FIGS. 5A-5B. FIG. 4A illustrates a linear plate extension function 34 comprised entirely of tensile (or entirely compressive) residual stress. As can be seen in FIG. 5A, the linear plate extension function 34 results in in-plane expansion 38 (i.e., tensile residual stress) or in-plane contraction 40 (i.e., compressive residual stress) of the plate. FIG. 4B is a schematic illustration of a linear plate bending function 32 comprised of a gradient of tensile and compressive residual stress. In FIG. 5B, the linear plate bending function 32 results in out-of-plane bending 42 of the arbitrary plate. The linear stress functions 32, 34 illustrated in FIGS. 4A-4B are basic examples of residual stress distributions for which a moment coefficient $C_M$ may be calculated and for which a stress function may be calibrated in a manner described in greater detail below.

Figure 6:
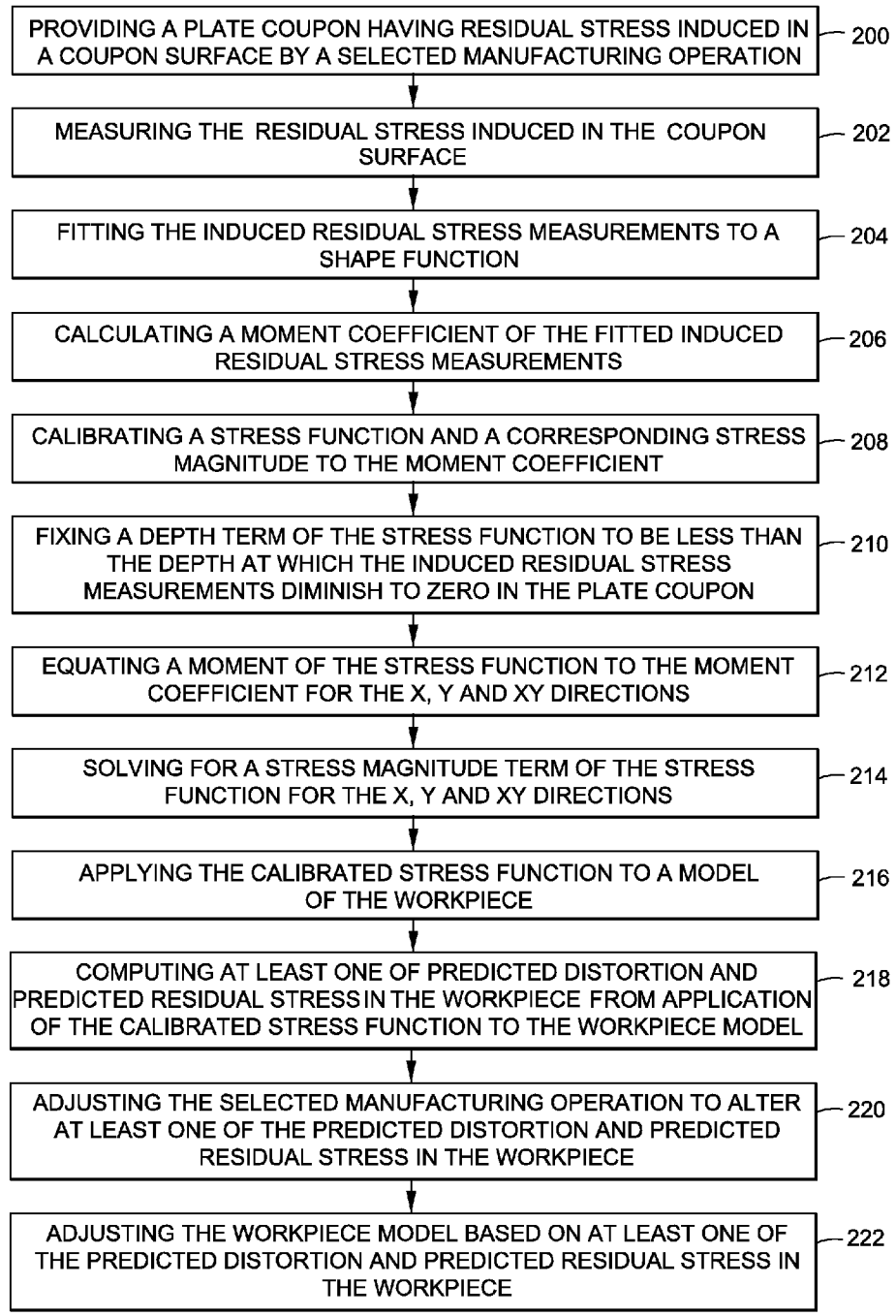
FIG. 6 is an illustration of one or more operations that may be performed by an embodiment for predicting distortion in a workpiece by calculating a moment coefficient characterizing the selected manufacturing operation that may be applied to the workpiece.

Reference is now made to the flow chart of FIG. 6 and the illustrations of FIGS. 1A-2 and FIGS. 9-18B in which one or more operations may be performed for predicting distortion in a workpiece 80 (FIG. 18A) manufactured using a selected manufacturing operation 108 (FIG. 1D). As was indicated earlier, the disclosed methodology may be applied to any manufacturing operation that induces residual stress in an isotropic material and is not limited to a machining operation having a rotary cutting tool 90 as illustrated in FIG. 1D.

In FIG. 6, Step 200 of the methodology may comprise providing the plate coupon 10 (FIG. 2) having residual stress induced in at least one of opposing coupon surfaces 12 (FIG. 1A) by the selected manufacturing operation 108 (FIG. 1D). In an embodiment, the plate coupon 10 may be provided by shaping and processing a plate stock 100 into the plate coupon 10 through a sequence of operations illustrated in FIGS. 1A-1D.

As shown in FIG. 2, the plate coupon 10 may have a generally thin orthogonal (e.g., rectangular) shape and may be generally flat or planar in its final shape. In an embodiment, the plate coupon 10 thickness may be in the range of from approximately 0.02 inch to approximately 0.10 inch. However, the plate coupon 10 may be formed in any suitable size, shape and configuration and is not limited to a thin rectangular configuration. The plate coupon 10 may be formed of any suitable isotropic material such as any suitable metallic material. The plate coupon 10 material may be substantially similar in composition to the material composition of the workpiece 80 (FIG. 18A) for which distortion is to be predicted. For example, the plate coupon 10 may be formed of titanium alloy such as a Ti6Al4V-alloy commonly used in aerospace applications due to its low density and high strength at elevated temperatures. However, the plate coupon 10 may be formed of any material, without limitation.

Referring to FIGS. 1A-1D, the plate coupon 10 may be formed by removing initial stress and/or bulk stress in the starting material such as the plate stock 100 illustrated in FIG. 1A. Initial stress or bulk stress may accumulate during various material processing operations such as forging, rolling, heat treating and other operations. In FIG. 1B, opposing surfaces 12 of the plate stock 100 may be rough machined to mechanically apply equivalent stress in both of the opposing surfaces 12 of the plate stock 100.

In FIG. 1C, the residual stress from the rough machining operation 102 (FIG. 1B) may be substantially eliminated by non-mechanically removing a relatively thin layer of material from both surfaces 12 of the plate stock 100. For example, each one of the opposing surfaces 12 may be electrochemically milled 104 as shown in FIG. 1C wherein a tool (e.g., an anode) may be placed in non-contacting relation to the surface 12 of the plate stock 100 such that a gap 106 exists between the anode and the plate stock 100 and such that a layer of the plate stock 100 containing residual stress may be removed from each one of the opposing surfaces 12. However, the above-described electrochemical milling process 104 is one of a variety of processes that may be employed to eliminate residual stress. In this regard, any suitable operation may be used for substantially reducing or eliminating residual stress in the surfaces 12 of the plate stock 100.

In FIG. 1D, the selected manufacturing operation 108 may be applied to one of the opposing surfaces 12 of the plate coupon 10 such that through-thickness residual stress is optionally uniformly induced across the length and width of the coupon surface 12. The selected manufacturing operation 108 may form a residual stress layer 16 within the coupon surface 12 immediately adjacent to an outer surface of the plate coupon 10. The residual stress layer 16 is identified as having a depth b1 which is the distance from the coupon surface 12 at which the residual stress diminishes to zero.

As can be seen in FIG. 2, the induced residual stress 18 in the residual stress layer 16 may be characterized in the x-direction, the y-direction and the xy-direction in alignment with a Cartesian coordinate system where the x and y directions are in-plane and the z-direction is the thickness $t_c$ direction of the plate coupon 10. However, the Cartesian coordinate system illustrated in the present disclosure is representative of one of a variety of alternative systems that may be implemented for characterizing the orientation of the induced residual stress 18 relative to the plane of the coupon surface 12.

Referring to FIG. 6, Step 202 may comprise measuring the induced residual stress 18 (FIG. 2) in the plate coupon 10 along at least one of the x-direction, the y-direction, and the xy-direction as illustrated in FIG. 2. Measured parameters may include the magnitude of the induced residual stress 18 at different depths of the plate coupon 10 and the relative orientation (i.e., compression or tension) of the induced residual stress 18 at different depths. Measurements of the induced residual stress 18 may be performed using any suitable stress measurement technique including, but not limited to, x-ray diffraction, neutron diffraction, laser interferometry, speckle interferometry, ultrasonic imaging, magnetic resonance imaging, and coupon boring, and sectioning or dissection of the plate coupon 10 with simultaneous strain measurement using strategically located strain gauges.

In Step 204 of FIG. 6, the induced residual stress measurements 50 (FIG. 9) for each one of the x, y and/or xy-directions may be fitted to a curve shape function 54 representing the distribution of the measured residual stress in each of the x, y and/or xy-directions. For example, FIG. 9 illustrates a least squares polynomial approximation of the induced residual stress measurements 50 fitted using EQ-50 listed below:

$$\sigma = \sum_{k=1}^{N} A_k \phi_k = \sum_{k=1}^{N} A_k \left(\frac{z-z_0}{z_0}\right)^{k+2} \quad \text{(EQ-50)}$$

wherein σ represents the residual stress fitted using the polynomial approximation for k=1 to N terms, $\phi_k$ represents a general shape function selected here as the polynomial function $[(z-z_0/z_0)]^{k+2}$, $A_k$ represents a constant coefficient multiplying the curve shape functions, z represents a variable depth of the plate coupon 10 (FIG. 2), and $z_0$ represents a maximum depth at which the induced residual stress 18 is measured using the chosen measurement technique (e.g., x-ray diffraction). The fitted polynomial approximation illustrated in FIG. 9 represents the actual induced residual strain distribution in the plate coupon 10 (FIG. 2).

In Step 206 of FIG. 6, the moment coefficients $C_M$ for each one of the x, y and/or xy directions are calculated from the fitted (e.g., polynomial approximation) induced residual stress measurements 50 (FIG. 9) for each one of the x, y and/or xy-directions by substituting the above equation EQ-50 for σ residual stress into equations EQ-10 and EQ-20 representing the resultant force and resultant moment, respectively, of residual stress distribution. The resulting equations EQ-60 and EQ-70 for respectively calculating the force coefficient $C_F$ and moment coefficient $C_M$ from the polynomial fit (FIG. 9) are as follows:

$$C_F = \sum_{k=1}^{N} A_k \int_0^{z_0} \left(\frac{z-z_0}{z_0}\right)^{k+2} dz \quad \text{(EQ-60)}$$

$$C_M = \sum_{k=1}^{N} A_k \int_0^{z_0} \left(\frac{z-z_0}{z_0}\right)^{k+2} \left(z - \frac{t}{2}\right) dz \quad \text{(EQ-70)}$$

In Step 208 of FIG. 6, a stress function (e.g., of residual stress) may be calibrated to the moment coefficient $C_M$. The calibrated stress function 60 (FIGS. 13, 15) may be applied to a model 92 (FIG. 18B) of the workpiece 80 (FIG. 18A). The workpiece model 92 may comprise any suitable model for simulating the response of the workpiece 80 to the application of stress or loads on the workpiece 80. For example, the workpiece model 92 may comprise, without limitation, a finite element model (FIG. 18B), a finite difference model, a finite volume model, or a plate equation of the workpiece 80.

The stress function 60 (e.g., FIGS. 13, 15) may be applied to the workpiece model 92 (FIG. 18B) for predicting distortion of the workpiece 80 (FIG. 18A) and/or for predicting residual stress in the workpiece 80. The stress function 60 may comprise any suitable function for applying stress to the model 92 of the workpiece 80. For example, the stress function 60 may comprise a step function 62 or a $3^{rd}$ order term function 64 graphically illustrated respectively in FIGS. 13 and 15 and described in greater detail below. The stress function 60 may include a depth term and a stress magnitude term applied along the depth.

For the step function 62, Step 208 of calibrating the stress function 60 to the moment coefficient $C_M$ may include Step 210 comprising fixing the depth term d of the step function 62 to be less than the depth at which the induced residual stress measurements 50 (FIG. 9) (e.g., via x-ray diffraction) become insignificant or diminish to zero in the plate coupon 10 (FIG. 2). Step 212 may comprise equating a moment of the step function 62 about the coupon neutral axis to the moment coefficient $C_M$. Step 214 may comprise solving for the stress magnitude term $S_{max}$ of the step function 62 for each one of the x, y, and the xy-directions. The stress magnitude $S_{max}$ may be calculated by solving the following equation EQ-80:

$$S_{max} = \frac{2C_M}{d(d-t_c)} \quad \text{(EQ-80)}$$

wherein $C_M$ represents the moment coefficient, d represents the depth along which the stress magnitude $S_{max}$ acts, and $t_c$ represents the thickness of the plate coupon.

For the $3^{rd}$ order term function 64, the stress magnitude term is A and the depth term is $z_0$. In Step 210, the stress magnitude A may be calculated by fixing the depth $z_0$ of the $3^{rd}$ order term function to be less than the depth at which the induced residual stress measurements 50 (FIG. 9) diminish to zero in the plate coupon 10 (FIG. 2). Step 212 may include equating the moment of the $3^{rd}$ order term function 64 to the moment coefficient $C_M$. Step 214 may include solving for the stress magnitude A for each one of the x, y, and/or xy-directions using the following equation EQ-90:

$$A = \frac{C_M}{\frac{z_0 t_c}{8} - \frac{(z_0)^2}{20}} \quad \text{(EQ-90)}$$

Referring still to FIG. 6, Step 216 may comprise applying the calibrated stress function 60 (FIGS. 13, 15) at corresponding calibrated stress magnitude ($S_{max}$ and A for the calibrated step function 62 and 3rd order term function 64, respectively) and corresponding fixed depth (d and $z_0$, respectively) to the workpiece model 92 such as the finite element model 92 illustrated in FIG. 18B. The calibrated stress function 60 may be applied to the workpiece model 92 in each one of the x, y and/or xy-directions.

Referring to FIGS. 11A-12C, shown are graphs illustrating the sensitivity of the calibrated stress magnitude $S_{max}$ and A for the calibrated step and 3rd order term functions 62, 64 (FIGS. 13, 15), respectively, relative to errors 58 in the moment coefficient $C_M$ for each one of the x, y, and/or xy-directions. More specifically, FIGS. 11A-11C illustrate relative error in the moment coefficient $C_M$ plotted against relative error in the calibrated stress magnitude $S_{max}$ of the step function 62. The plotted errors in the moment coefficient $C_M$ are a result of errors artificially added to the induced residual stress measurements 50 (FIG. 9) in the plate coupon 10 (FIG. 2) as measured by x-ray diffraction. Likewise, FIGS. 12A-12C illustrate the relative error in the moment coefficient $C_M$ plotted against relative error in the calibrated stress magnitude A of the $3^{rd}$ order term function 64 (FIG. 15) wherein the moment coefficient $C_M$ errors are the result of errors artificially added to the induced residual stress measurements 50.

For the moment coefficients $C_M$ plotted in FIGS. 11A-12C, the magnitude of the error added to the induced residual stress measurements 50 (FIG. 9) in each of the x, y and/or xy-directions was set to be no larger that five percent (5%) of the maximum out-of-plane displacement of the plate coupon 10 (FIG. 2) measured by x-ray diffraction. As can be seen in FIGS. 11A-12C, the relative error 58 propagation in the calibrated stress magnitude $S_{max}$ and A for the step and 3rd order term functions, 62, 64, respectively, is linear relative to the errors in the moment coefficient $C_M$. Furthermore, it can be seen that the errors in the calibrated stress magnitudes $S_{max}$ and A are on the same order of magnitude as the errors in the moment coefficients $C_M$.

Referring to FIG. 6, Step 218 may comprise computing predicted distortion and/or predicted residual stress in the workpiece 80 (FIG. 18A) resulting from application of the calibrated stress function 60 (FIGS. 13, 15) to the workpiece model 92 (FIG. 18B) at the calibrated stress magnitude and corresponding depth. Distortion and/or residual stress may be predicted in a workpiece 80 of any thickness. As indicated above, the stress function 60 represents the stress distribution profile in the through-thickness direction. The calibrated stress function 60 is applied to the workpiece model 92 at the calibrated stress magnitude and corresponding depth.

Figure 13:
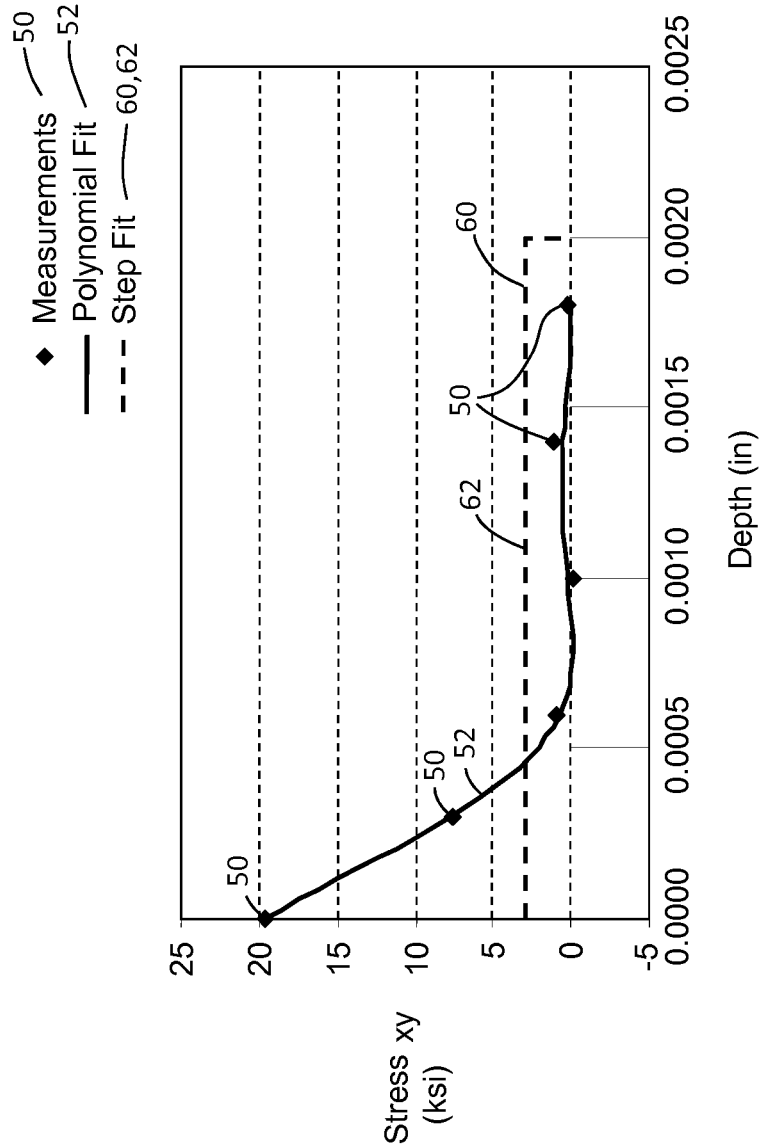
FIG. 13 is an illustration of a graph of stress magnitude in the xy-direction versus depth and illustrating a polynomial fit of the induced residual stress measurements superimposed with a plot of the calibrated step function.

FIG. 13 is an illustration of a graph of calibrated stress magnitude $S_{max}$ of a step function 62 in the xy-direction versus depth d. The plot of the calibrated step function 62 is superimposed over a plot of a polynomial fit of the induced residual stress measurements 50 for a plate coupon 10 (FIG. 2) having a thickness of 0.040 inch. In FIG. 13, the stress magnitude $S_{max}$ of the step function 62 for fixed depth d of 0.002 inch is calibrated to be substantially equivalent to the moment coefficient $C_M$. As discussed above, the moment coefficient $C_M$ is the moment resultant of the through-thickness residual stress distribution which is represented in FIG. 13 by the polynomial fit of the induced residual stress measurements 50 in the xy-direction.

Figures 14A, 14B:
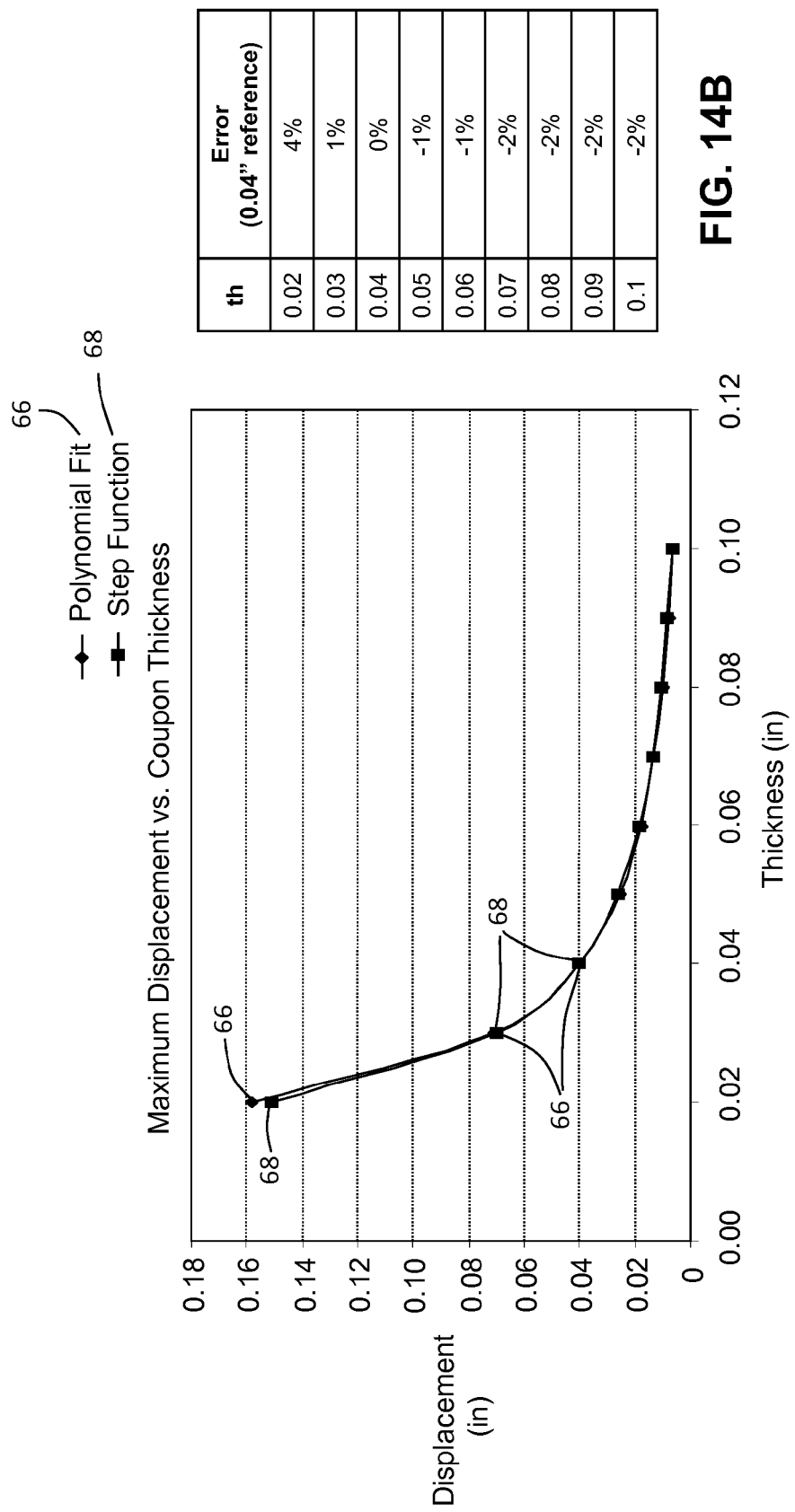
FIG. 14A is an illustration of a graph of the accuracy of the step function in predicting displacement of a workpiece.
FIG. 14B is an illustration of a table of the different workpiece thicknesses and associated displacement errors of workpieces subjected to the calibrated step function illustrated in FIG. 14A.

FIG. 14A is a graph illustrating the accuracy of the calibrated step function 62 in predicting out-of-plane displacement (i.e., bending) of a workpiece 80 (FIG. 18A) in the xy-direction. More specifically, FIG. 14A is an illustration of a graph plotting predicted workpiece displacement versus workpiece thickness. The workpiece thicknesses range from 0.002 to 0.010 inch. Displacements were computed and the displacements 68 were plotted for different workpiece thicknesses subjected to the calibrated step function 62 stress magnitude $S_{max}$ along a depth d of 0.002 inch as illustrated in FIG. 13. Displacements were also computed and the displacements 66 were plotted in FIG. 14A for workpiece thicknesses subjected to the stress distribution profile (i.e., the polynomial fit) of the induced residual stress measurements 50 from x-ray diffraction as plotted in FIG. 13.

FIG. 14B illustrates a table of the relative out-of-plane displacement error versus workpiece thickness as plotted in FIG. 14A. More specifically, FIG. 14B illustrates the different workpiece thicknesses and the corresponding error in the predicted displacements 68 (FIG. 14A) for workpieces subjected to the calibrated stress magnitude $S_{max}$ relative to the displacements 66 (FIG. 14A) in workpieces subjected to the induced residual stress measurements 50 from x-ray diffraction. It can be seen in FIG. 14B that the relative error 58 in displacements is lowest for the case where the workpiece thickness is substantially equivalent to the coupon thickness (i.e., 0.040 inch) from which the induced residual stress measurements 50 were taken. The relative error 58 in displacement can be seen as increasing with increasing workpiece thickness. However, it can also be seen in FIG. 14B that the displacement error is relatively small (i.e., less than 5%) for workpiece thicknesses that differ from the coupon thickness by at least one half of the coupon thickness.

Figure 15:
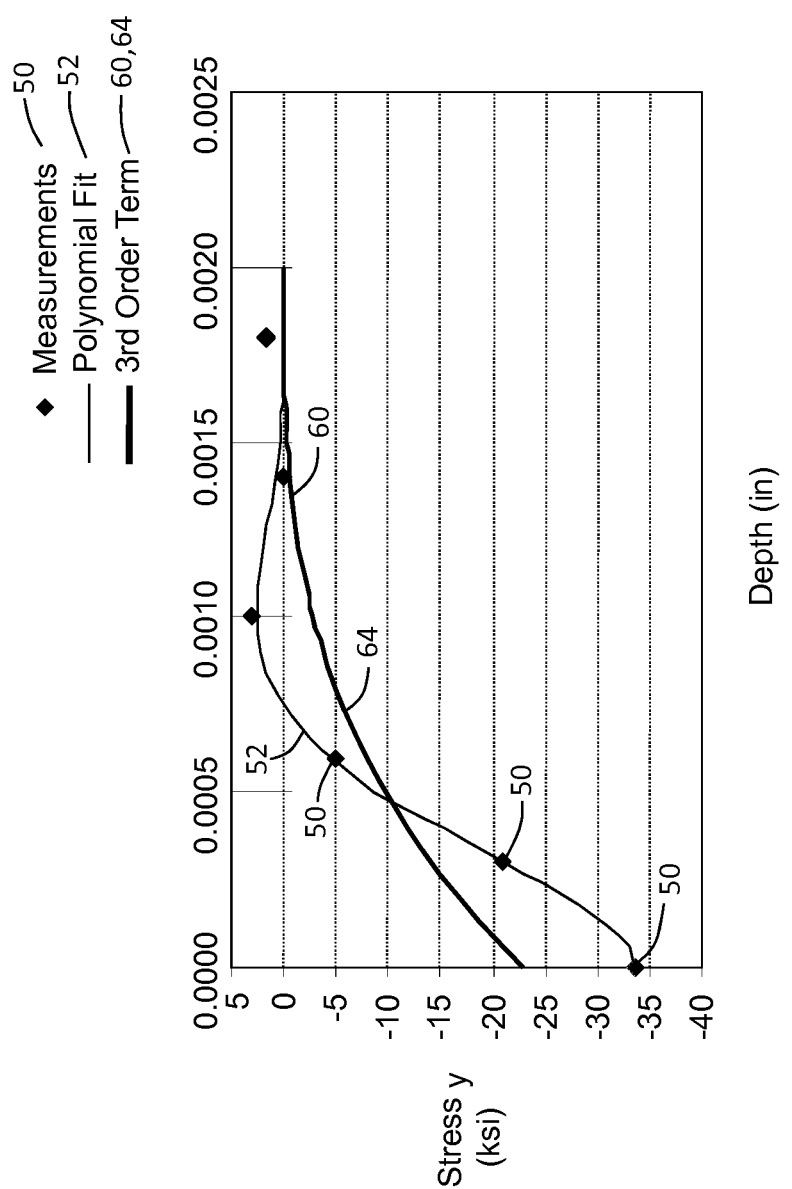
FIG. 15 is an illustration of a graph of stress magnitude in the y-direction versus depth and illustrating a polynomial fit of the induced residual stress measurements superimposed with a plot of the calibrated $3^{rd}$ order term function.

FIG. 15 is a graph of calibrated stress magnitude A in the y-direction versus depth $z_o$ for a calibrated $3^{rd}$ order term function 64. The plot of the calibrated $3^{rd}$ order term function 64 is superimposed over a plot of a polynomial fit of the induced residual stress measurements 50 for a plate coupon 10 (FIG. 2) of 0.040 inch thickness. The stress magnitude A of the $3^{rd}$ order term function 64 for fixed depth $z_0$ of 0.002 inch is calibrated to be substantially equivalent to the moment coefficient $C_M$ computed from the induced residual stress measurements 50 as described above with regard to FIG. 9.

Figures 16A, 16B:
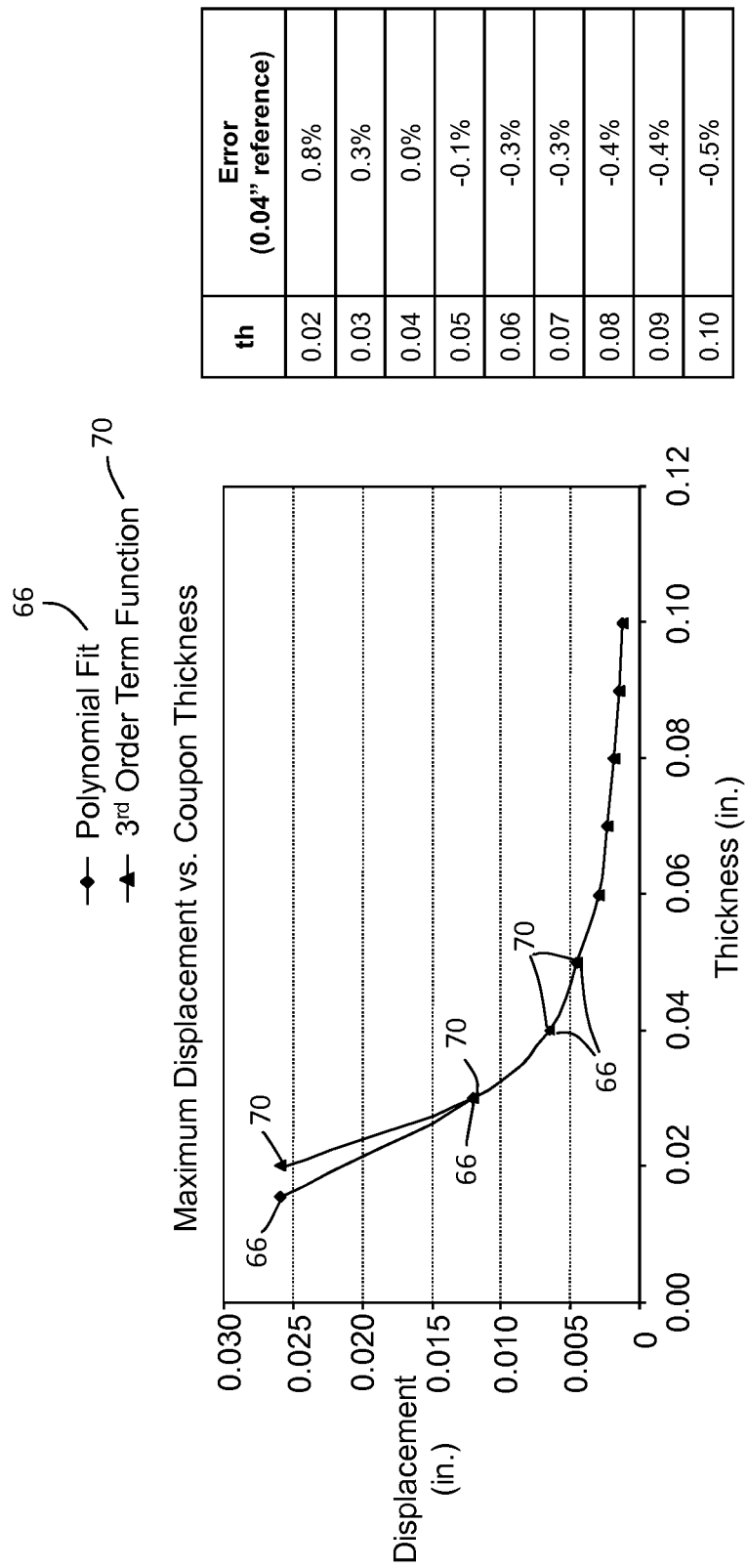
FIG. 16A is an illustration of a graph of error of the $3^{rd}$ order term function in predicting displacement of a workpiece.
FIG. 16B is an illustration of a table of the different workpiece thicknesses and associated displacement errors of workpieces subjected to the calibrated step function illustrated in FIG. 16A.

FIG. 16A is a graph illustrating the accuracy of the calibrated $3^{rd}$ order term function 64 in predicting out-of-plane displacement (i.e., bending) of a workpiece 80 (FIG. 18A) in the y-direction. More specifically, FIG. 16A illustrates a plot of predicted workpiece displacement versus workpiece thickness. Displacements 70 (FIG. 16A) were plotted for different thicknesses (e.g., 0.002 to 0.010 inch) of workpieces 80 (FIG. 18B) subjected to the calibrated 3rd order term function 64 stress magnitude A along depth d of 0.002 inch as illustrated in FIG. 15. Displacements 66 were also plotted for workpiece thicknesses subjected to the stress distribution profile (i.e., the polynomial fit) of the induced residual stress measurements 50 from x-ray diffraction plotted in FIG. 15.

FIG. 16B illustrates a table of the relative out-of-plane displacement error versus workpiece thickness as plotted in FIG. 16A. More specifically, FIG. 16B illustrates the error in predicted displacements 70 for different workpieces thicknesses subjected to the calibrated $3^{rd}$ order term function 64 (FIG. 15) stress magnitude A relative to the displacements 66 (FIG. 16A) in workpieces subjected to the induced residual stress measurements 50 from x-ray diffraction. It can be seen in FIG. 16B that the displacement error is lowest where the workpiece thickness is substantially equivalent to the coupon thickness (i.e., 0.040 inch) and that the displacement error is relatively small (i.e., less than 1%) for workpiece thicknesses that differ from the coupon thickness by at least one half of the coupon thickness.

FIG. 17 illustrates a table of different depths along a stress distribution profile and the associated errors 72 in the calculated stress coefficient $C_F$ relative to the resultant of the actual stress at the given depths. As indicated above, the stress coefficient $C_F$ may be calculated by equation EQ-60 using the measured residual stress distribution in the plate coupon 10 (FIG. 2). The actual stress distribution is from the induced residual stress measurements 50 (FIG. 9) using any suitable residual stress measurement technique such as x-ray diffraction. Although the stress coefficient $C_F$ is not equivalent to the resultant of the actual stress at a given depth, the relative error of the stress coefficient $C_F$ is relatively small for depths that are within the actual stress distribution profile. Furthermore, because in-plane displacement (e.g., expansion 38 and contraction 40—FIG. 5A) is related to the stress coefficient $C_F$, relatively small errors in the stress coefficient $C_F$ correspond to relatively small errors in predicted in-plane displacement.

FIG. 18A is a perspective illustration of a non-limiting example of a workpiece 80 (FIG. 18A) for which distortion and/or residual stress may be predicted based upon the calibrated stress function 60 (FIGS. 13, 15) that may be applied to the workpiece model 92 (FIG. 18B). In an embodiment, the stress function 60 may comprise a step function 62 or a $3^{rd}$ order term function 64 as described above. However, the stress function 60 may comprise any suitable function representing a stress distribution or stress profile that may be applied to a model for predicting distortion and or residual stress in a workpiece 80. As described above, the stress function 60 may be calibrated to the moment coefficient $C_M$. The moment coefficient $C_M$ represents the resultant of the residual stress induced in the plate coupon 10 (FIG. 2) by a selected manufacturing operation 108 (FIG. 1D). Parameters such as stress magnitude and depth of the induced residual stress 18 (FIG. 2) may vary with different manufacturing operations and different material compositions of the workpiece 80 as indicated above. For example, the residual stress magnitude and through-thickness profile may vary for different machining parameters such as different cutting tool geometry, cutting tool rotation speed, feed rate, and tool cutting surface.

Further in this regard, FIG. 18A illustrates a cutting tool 90 having a tool end 86 cutting surface for removing material from the webs 82 of the workpiece 80 and a tool side 88 cutting surface for removing material from the rib 84 of the workpiece 80. All other machining parameters being equal, the tool end 86 of the cutting tool 90 may induce a different residual stress magnitude and through-thickness profile in the webs 82 compared to the magnitude and profile of the residual stress generated in the rib 84 by the tool side 88 of the cutting tool 90. Therefore, the calibrated stress function 60 (FIGS. 13, 15) and stress magnitude applied to the webs 82 of the finite element model 92 in FIG. 18B may be different than the calibrated stress function 60 applied to the rib 84 of the finite element model 92 resulting in different values for predicted distortion in the webs 82 as compared to predicted distortion in the rib 84.

The present methodology may include building an empirical database of different manufacturing operations and corresponding moment coefficients $C_M$. For example, in the context of mechanical machining, the database may include the above-mentioned parameters of tool geometry, cutting tool rotation speed, feed rate, and tool cutting surface (e.g., tool side 88, tool end 86). Additional non-limiting examples of machining parameters include workpiece material composition, cutting tool material, cutting mode (e.g., climbing), tool path (e.g., helical, back-and-forth) and any one of a variety of additional parameters. The database of different manufacturing operations may include multiple parameter sets, each of which may correspond to a moment coefficient $C_M$ for calibrating a stress function 60 to be applied to a workpiece model 92 (FIG. 18B) including, but not limited to, a finite element model.

Referring again to FIG. 6, Step 220 may comprise adjusting the selected manufacturing operation 108 (FIG. 1D) to alter the predicted distortion in the workpiece 80 (FIG. 18A) and/or to alter the predicted residual stress in the workpiece 80. For example, a stress function 60 (FIGS. 13, 15) calibrated to a different moment coefficient may be applied to the workpiece finite element model 92 (FIG. 18B) in order to achieve a different residual stress distribution in the workpiece 80 (FIG. 18A). The different moment coefficient $C_M$ may represent a different manufacturing operation. For example, the different stress function may be calibrated to a moment coefficient $C_M$ representing a machining operation that uses a slower-turning cutting tool or a cutting tool geometry that reduces the predicted residual stress or distortion in the workpiece model 92 (FIG. 18B). Alternatively, the stress function 60 may be calibrated to a moment coefficient $C_M$ representing a machining operation that produces compressive residual stress of increased magnitude and at a greater depth to improve fatigue strength and/or fatigue life of the workpiece 80.

In regard to improving the modeling solution of the workpiece 90, Step 222 of FIG. 6 may comprise iteratively adjusting the workpiece model 92 (FIG. 18B) based upon the predicted distortion in the workpiece 80 and/or the predicted residual stress in the workpiece 80 resulting from application of the calibrated stress function 60 (FIGS. 13, 15). For example, based upon the results of a finite element analysis of a calibrated stress function 60 applied to the workpiece model 92, the model mesh (i.e., finite elements) may be adjusted to align the mesh elements with locations of relatively high magnitude residual stresses. In another non-limiting example, the finite element model boundary conditions (e.g., constraints, loads) may be adjusted based upon the predicted distortion in the model 92.

Figure 7:
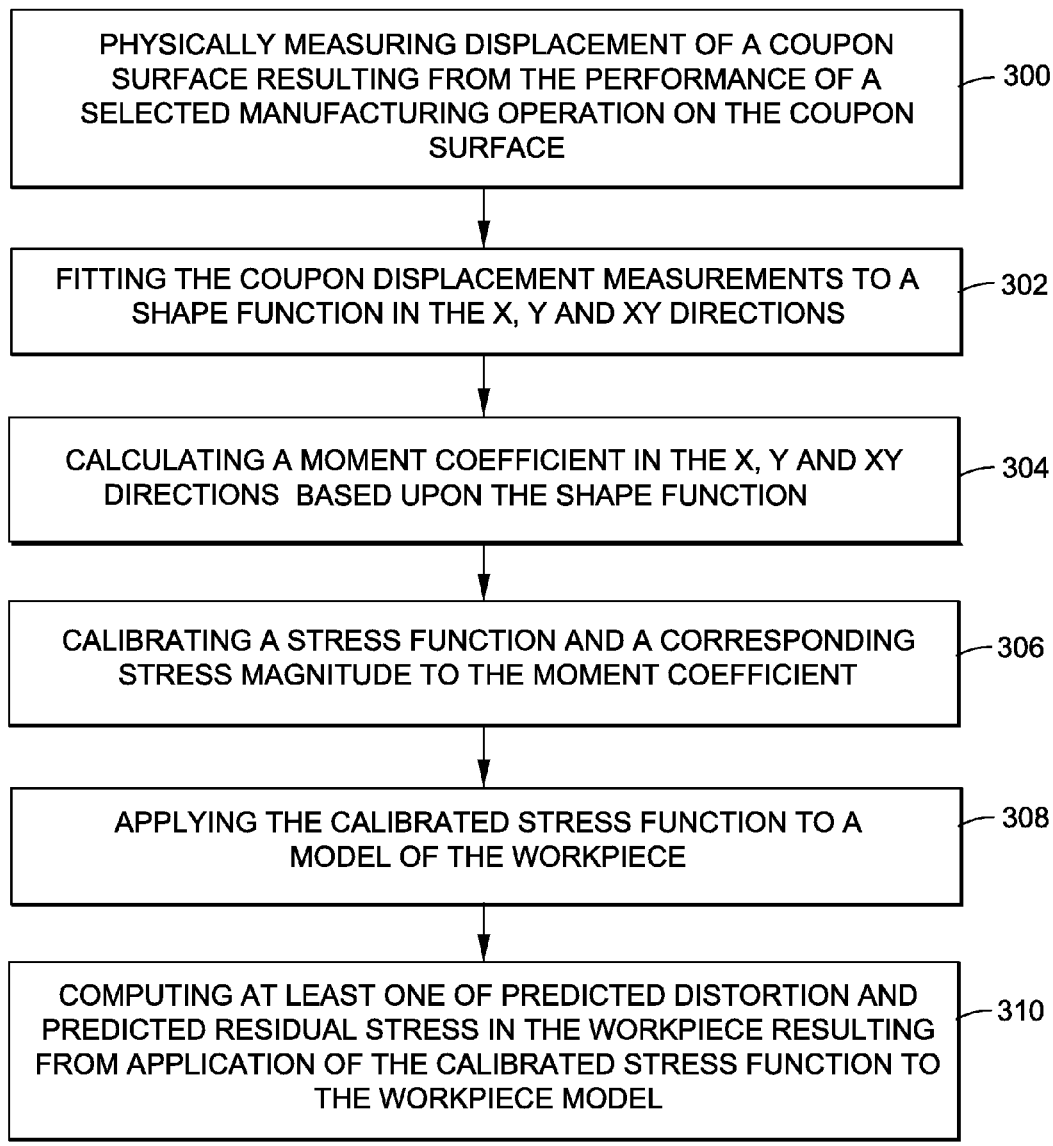
FIG. 7 is an illustration of one or more operations that may be performed by an embodiment for predicting distortion in a workpiece wherein the moment coefficient is calculated using measurements of the coupon surface displacement resulting from the performance of the selected manufacturing operation on the coupon surface.

Referring to the flow chart of FIG. 7, an embodiment of the methodology may comprise Step 300 of physically measuring displacement of the coupon surface 12 (FIG. 2) in the x, y and/or xy-directions and calculating the moment coefficient $C_M$ based on the displacement of the coupon surface 12 (FIG. 1A-1D and FIG. 2). As indicated above, the performance of the selected manufacturing operation 108 (FIG. 1D) on the coupon surface 12 induces residual stress 18 (FIG. 2) in the coupon surface 12 and causes distortion of the coupon surface 12. Displacement of the coupon surface 12 may be measured by any suitable technique for measuring part geometry. For example, displacement of the coupon surface 12 may be measured using optical metrology such as with an advanced topometric sensor (ATOS) to generate section data and/or point cloud data representative of the distorted coupon surface 12. Displacement of the coupon surface 12 may also be measured with a coordinate measuring system using a touch probe or any other suitable measurement technique, without limitation.

Figure 10A:
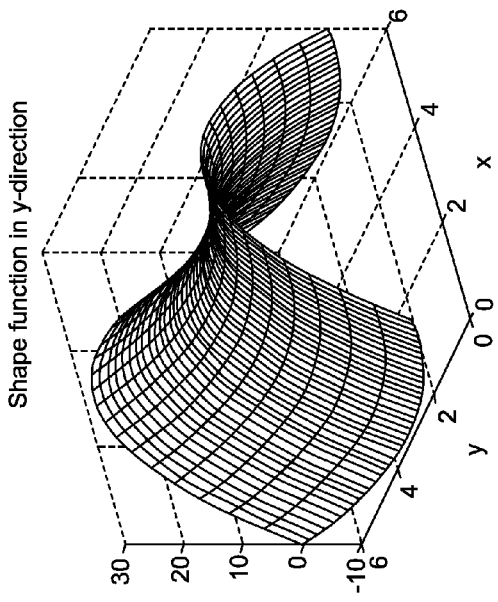
FIG. 10A is an illustration of a displacement shape function computed from the induced residual stress measurements acting in an x-direction of the plate coupon.
Figure 10B:
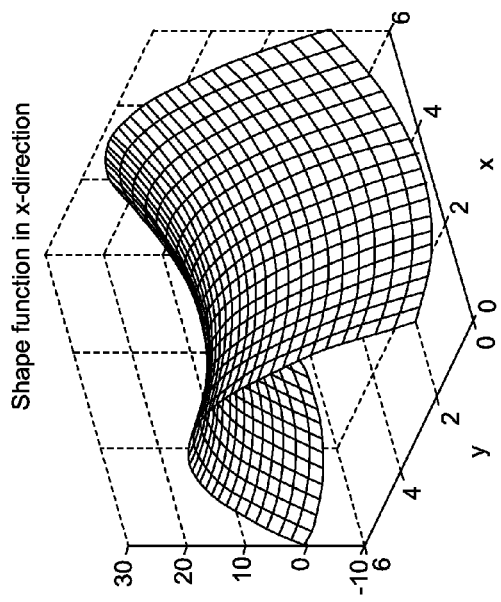
FIG. 10B is an illustration of a displacement shape function computed from the induced residual stress measurements acting in a y-direction of the plate coupon.
Figure 10C:
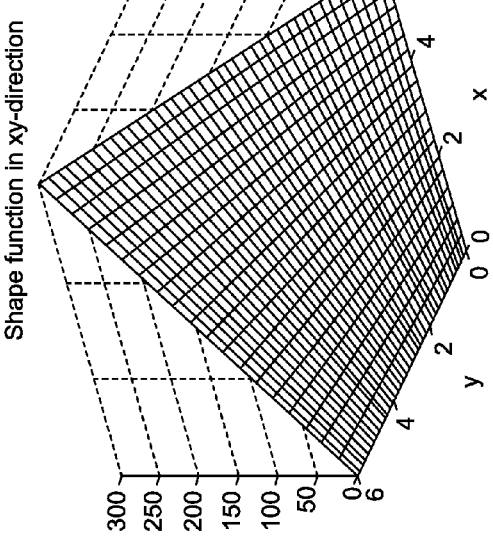
FIG. 10C is an illustration of a displacement shape function computed from the induced residual stress measurements acting in an xy-direction of the plate coupon.

In Step 302, the coupon displacement measurements may be fitted to a displacement shape function 56 in at least one of the x, y and/or xy-directions similar to the displacement shape functions 56 illustrated in FIGS. 10A, 10B and 10C. The displacement shape functions 56 in the x, y and/or xy-directions may be calculated by solving for the eigenstrain using equations of elasticity (i.e., Young's modulus, Poisson's ratio) to convert the calculated stress function. In Step 304, the moment coefficient $C_M$ in at least one of the x, y and x-y directions may be calculated based on the shape function.

Referring still to FIG. 7, the method may further comprise Step 306 of calibrating a stress function 60 and a corresponding stress magnitude to the moment coefficient $C_M$ in a manner as described above. The method may additionally comprise Step 308 of applying the calibrated stress function 60 (e.g., FIGS. 13, 15) to a model 92 such as the finite element model 92 illustrated in FIG. 18B. Step 310 of the methodology illustrated in FIG. 7 may comprise computing predicted distortion of the workpiece 80 (FIG. 18A) resulting from application of the calibrated stress function 60 to the workpiece model 92 as is described above with regard to the methodology illustrated in FIG. 6.

The moment coefficient $C_M$ may optionally be calculated by applying the fitted induced residual stress measurements 52 (FIG. 9) to a model of the plate coupon 10 (FIG. 2) such as a finite element model 14 (FIG. 2A) and extracting coupon surface 12 (FIG. 2) displacement measurements in the x, y and/or xy-directions resulting from the application of the fitted induced residual stress measurements 52 to the coupon model 14. The coupon displacement measurements may then be fitted to a displacement shape function 56 such as that which is illustrated in FIGS. 10A-10C and described above with regard to Step 302 of FIG. 7.

The moment coefficient $C_M$ may be calculated for the x, y and/or xy-directions using the following equation EQ-100:

$$C_M = \frac{A_1 t_c^3}{12} \qquad \text{(EQ-100)}$$

wherein $A_1$ represents the fitted coefficient (i.e., multiplier) of the displacement shape function 56 in the x, y and/or xy-directions, and $t_c$ represents the coupon thickness. As indicated above, the moment coefficient $C_M$ represents the induced residual stress moment about a neutral axis of the plate coupon based upon the displacement shape function 56 (FIGS. 10A-10C).

Advantageously, the above-described process in FIG. 7 of physically measuring displacement of the coupon surface 12 (FIG. 2) to determine the moment coefficient $C_M$ may avoid inaccuracies and costs associated with measurement of residual stress 18 (FIG. 2) in a coupon surface for determining the moment coefficient $C_M$. For example, measurement of residual stress 18 using x-ray diffraction or neutron diffraction may be cost and schedule prohibitive considering the cost of materials and the time and expense required for machining of plate coupons and analysis of measurement results. Coupon boring may provide a low-cost alternative for measuring stress in general. However, coupon boring may present challenges in measuring residual stress in a coupon surface 12 (FIG. 2) with the relatively high degree of accuracy necessary for determining the moment coefficient $C_M$. Likewise, laser interferometry, speckle interferometry, ultrasonic imaging and magnetic resonance imaging may also present challenges in measuring residual stress. Dissection or slitting, although favorable from a cost standpoint, may also present challenges in providing the degree of accuracy necessary for measuring residual stress 18 in a plate coupon.

Figure 8:
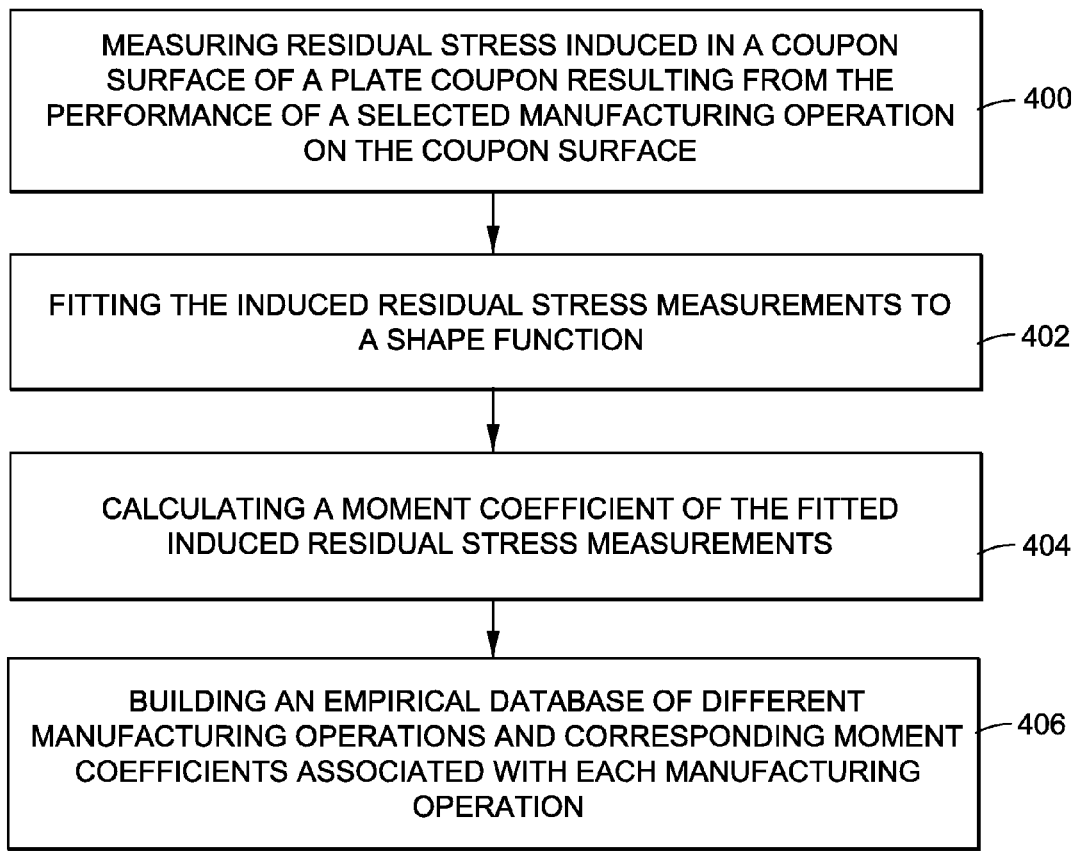
FIG. 8 is an illustration of one or more operations that may be performed by an embodiment for building a database of different manufacturing operations and corresponding moment coefficients.

Referring to FIG. 8, the present disclosure includes a methodology for building a database of moment coefficients $C_M$, each of which may correspond to a selected manufacturing operation 108 (FIG. 1D) as mentioned above. Step 400 of the methodology may comprise measuring induced residual stress 18 in a coupon surface 12 (FIG. 2) of the plate coupon 10 similar to that described above. The plate coupon 10 (FIG. 2) residual stress may be induced in the coupon surface 12 by the selected manufacturing operation 108 (FIG. 1D). Step 402 may comprise fitting the coupon displacement measurements to a curve shape function 54 in the x, y and/or xy-directions similar to that which is illustrated in FIG. 9 and described above.

Step 404 of FIG. 8 may comprise calculating the moment coefficient $C_M$ representative of the residual stress 18 (FIG. 2) induced in the plate coupon 10 (FIG. 2) by the selected manufacturing operation 108 (FIG. 1D) using equation EQ-70 described above. Step 406 may comprise building an empirical database of different manufacturing operations (i.e., mechanical and non-mechanical) and corresponding moment coefficients associated with each manufacturing operation as described above in the context of mechanical machining. In this regard, the database may include one or more of any number of different parameters associated with machining the plate coupon 10 (FIG. 2) and which may affect the residual stress induced in the coupon surface 12 (FIG. 2) by a selected machining operation.

Advantageously, the embodiments disclosed herein provide a means to predict distortion and/or residual stress that may occur in a workpiece 80 and adjust manufacturing operations to minimize the residual stress magnitude in the workpiece 80. For example, one or more of the embodiments disclosed herein may be advantageously implemented in the aerospace industry wherein machining parameters may be adjusted to reduce or eliminate distortion in a metallic workpiece as a result of a machining operation performed on the workpiece. Illustrating this point by way of example, the above-described processes were applied to an aluminum workpiece designed as an elongated planar member having width and length dimensions of approximately twelve (12) inches and eighty-six (86) inches, respectively. The planar member was comprised of a series of webs extending along the length of the workpiece. The webs were machined to relatively small thicknesses ranging from approximately 0.090 to 0.277 inch. Each web was separated from adjacent webs along the length of the workpiece by a ribs extending outwardly from the webs and oriented transversely relative to the workpiece length.

The aluminum workpiece was machined using a set of original machining parameters that resulted in bending distortion in the aluminum workpiece due to residual stress from the machining operation. The distortion in the aluminum workpiece was characterized by a generally constant curvature along the length direction of the workpiece with a measured displacement of approximately 4 inches at one end of the workpiece relative to an opposite end of the workpiece. Due to the degree of curvature, re-working of the aluminum workpiece by straightening was required to remove the curvature to bring the workpiece within acceptable tolerances. Test coupons were measured to determine the moment coefficient for calibrating a stress function that was applied to a finite element model of the aluminum workpiece. The test coupons were representative of the aluminum alloy of the workpiece and the original machining parameters. The finite element solution resulting from application of the calibrated stress function was a predicted distortion of approximately 3.3 inches (i.e., bending) in the workpiece induced in the workpiece by the original machining parameters and which correlated with the measured workpiece distortion of approximately 4 inches.

The machining parameters and finite element model of the aluminum workpiece were then adjusted and optimized until the predicted distortion fell within acceptable limits. The optimization process resulted in a predicted distortion of approximately 0.009 inch of bending displacement (i.e., curvature) along the length direction of the workpiece. The workpiece was then machined using the optimized machining parameters resulting in distortion that was not measurable due to the small magnitude of the distortion. The same process described above for reducing distortion may be used to optimize manufacturing parameters to induce the formation of residual stresses that are favorable (e.g., predominantly compressive) in a workpiece such as to enhance fatigue life and/or minimize crack growth. Furthermore, the above-described example is not to be construed as being limited to machining of metallic structures for the aerospace industry but may be applied to any manufacturing operation without limitation and may be implemented in any industry where residual stress is induced in any type of workpiece as a result of the application of energy such as heat and/or force to a workpiece.

Figure 19:
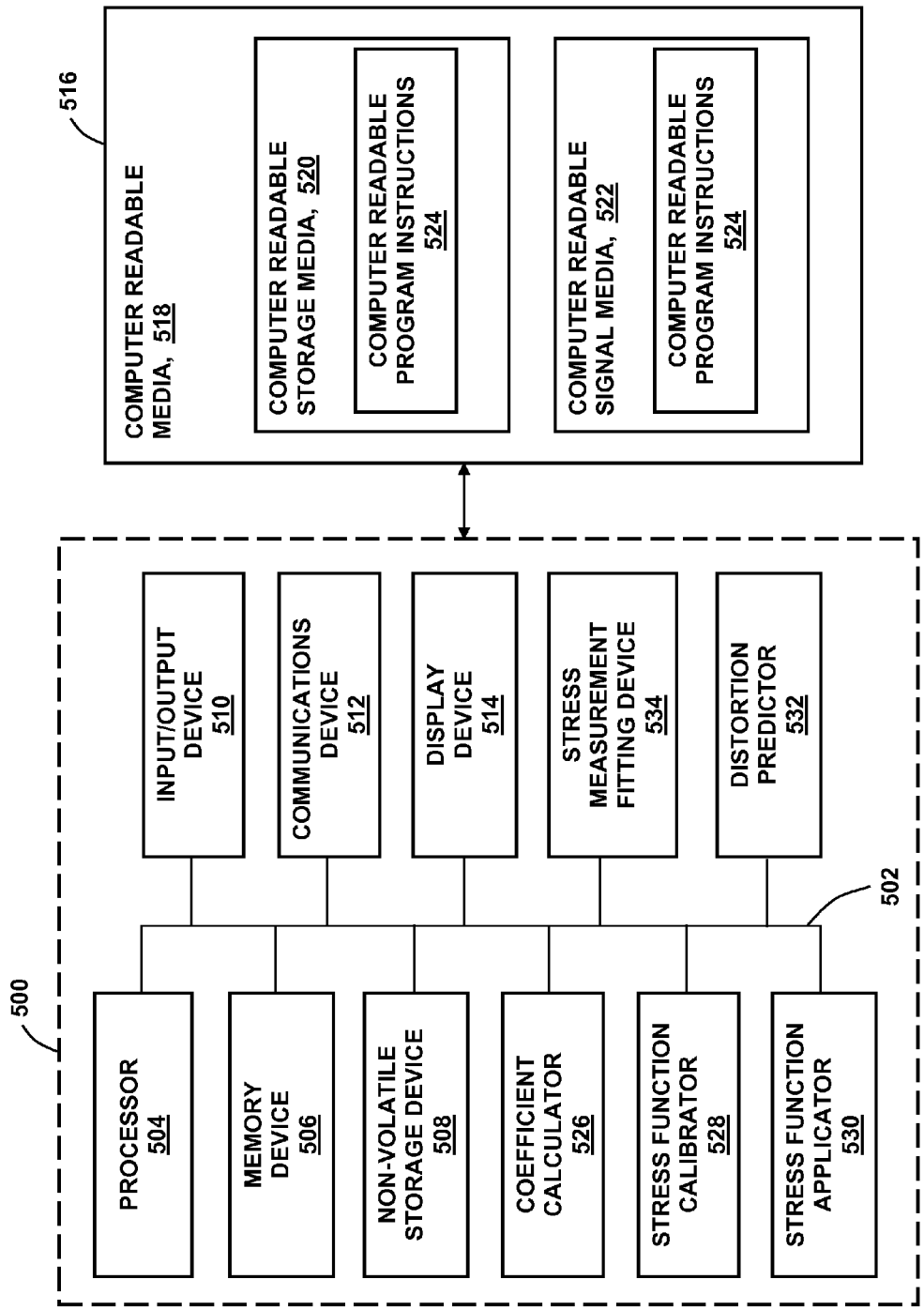
FIG. 19 is a block diagram of an embodiment of a processor-based system for implementing one or more operations of a methodology for predicting residual stress and/or distortion in a workpiece.

Referring to FIG. 19, the above-described steps of the disclosed methodologies or any combination of the steps, in whole or in part, may be implemented in a computer-implemented process such as on a processor-based system 500 or other suitable computer system. The processor-based system 500 may perform computable readable program instructions 524. The computable readable program instructions 524 may be provided to or loaded onto the processor-based system 500 in order to implement one or more of the above-described operations or steps. In a non-limiting example, the processor-based system 500 and/or the computable readable program instructions 524 may facilitate the prediction of residual stress 18 (FIG. 2) and or distortion (FIGS. 13, 15) induced in a workpiece 80 (FIG. 18A) manufactured using a selected manufacturing operation 108 (FIG. 1D).

The block diagram of FIG. 19 illustrates the processor-based system 500 in an advantageous embodiment that may use measurements of residual stress 18 induced (FIG. 9) in a plate coupon 10 (FIG. 2) manufactured by the selected manufacturing operation 108 (FIG. 1D) to predict residual stress 18 in a workpiece 80 (FIG. 18A) as described in greater detail below. In the embodiment illustrated in FIG. 19, the processor-based system 500 may include a data communication path 202 (e.g., data link) to communicatively couple one or more components to facilitate transfer of data between such components. The communication path 202 may comprise one or more data buses or any other suitable communication path that facilitates the transfer of data between the components and devices of the processor-based system 500.

In a non-limiting embodiment, the components may include one or more of a processor 504, a memory device 506, a non-volatile storage device 508, a communications device 512, an input/output device 510, and a display device 514, a coefficient calculator 526, a stress function calibrator 528, a stress function applicator 530, a distortion predictor 532, and a stress measurement fitting device 534. The coefficient calculator 526 may calculate the moment coefficient $C_M$ representative of residual stress 18 induced in a plate coupon 10 (FIG. 2) by the selected manufacturing operation 108 (FIG. 1D).

The coefficient calculator 526 may calculate the moment coefficient $C_M$ in a manner described above with regard to Step 206 of FIG. 6 or in a manner described above with regard to Step 304 of FIG. 7 or Step 404 of FIG. 8. For example the coefficient calculator 526 may calculate the moment coefficient using the fitted induced residual stress measurements 50 (FIG. 9) in the plate coupon 10 for each one of the x, y and/or xy-directions. The fitted induced residual stress measurements 50 may be determined in a manner as described above in Step 202 wherein the residual stress 18 (FIG. 2) induced in the plate coupon 10 may be measured along at least one of the x-direction, the y-direction, and the xy-direction such as by using x-ray diffraction or any other suitable stress measurement technique.

The stress measurement fitting device 534 may receive the induced residual stress measurements 50 (FIG. 9) which may be input into the stress measurement fitting device 534 using the input/output device 510 so that the stress measurement fitting device 534 may fit the induced residual stress measurements 50 to a curve shape function 54 such as the least squares polynomial approximation illustrated in FIG. 9 by using EQ-50 as described above in Step 204. The fitted polynomial approximation illustrated in FIG. 9 may represent the actual induced residual strain distribution in the plate coupon 10 (FIG. 2). The induced residual stress measurements 50 (FIG. 9) may be provided to the coefficient calculator 526 via the communication path 502 such that the coefficient calculator 526 may then calculate the moment coefficient $C_M$ for the x, y and/or xy-directions.

Referring still to FIG. 19, the stress function calibrator 528 may calculate the moment coefficient $C_M$ from the fitted (e.g., polynomial approximation) induced residual stress measurements 50 (FIG. 9) for each one of the x, y and/or xy-directions using EQ-70 as described above in Step 208. For example, the depth term d in EQ-80 of the depth term $z_0$ in EQ-90 may be set to be less than the depth at which the induced residual stress measurements diminish to zero in the plate coupon 10 (FIG. 2) as described above with regard to Step 210. The stress function calibrator 528 may then equate the moment of the step function 62 (FIG. 13) or the $3^{rd}$ order term function 64 (FIG. 15) to the moment coefficient $C_M$ as described above in Step 212 and solve for the stress magnitude term $S_{max}$ (EQ-80) of the step function 62 or the stress magnitude term A (EQ-90) the $3^{rd}$ order term function 64 for each one of the x, y, and the xy-directions as described above in Step 214.

The stress function applicator 530 may receive the calibrated stress function from the stress function calibrator 528 via the communication path 502 illustrated in FIG. 19. The stress function applicator 530 may apply the calibrated stress function to a model of the workpiece 90 (FIG. 18A) such as the finite element model 92 illustrated in FIG. 18B in a manner as described above in Step 216. For example, the stress function applicator 530 may apply the calibrated stress function 60 (FIGS. 13, 15) to the workpiece model 92 at the calibrated stress magnitude $S_{max}$ (EQ-80) and A (EQ-90) for the corresponding calibrated step function 62 and $3^{rd}$ order term function 64, respectively, along the corresponding fixed depth (d and $z_o$, respectively) of the calibrated stress magnitude $S_{max}$ and A. However, as was indicated above, the stress function applicator 530 may apply any calibrated stress function to a workpiece model 92 and is not limited to applying a calibrated step function 62 (FIG. 13) or a calibrated $3^{rd}$ order term function 64 (FIG. 15).

Referring still to FIG. 19, the distortion predictor 532 may compute predicted distortion and/or predicted residual stress in the workpiece 80 (FIG. 18A) resulting from application of the calibrated stress function 60 (FIGS. 13, 15) to the workpiece model 92 (FIG. 18B) at the calibrated stress magnitude $S_{max}$ (EQ-80) and A (EQ-90) and corresponding depth (d and $z_0$, respectively) as described above in Step 218. The distortion predictor 532 may receive the results from the application of the calibrated stress function to workpiece model 92 (FIG. 18B) by the stress function applicator 530 such as via the communication path 502. The results of the predicted distortion and/or predicted residual stress in the workpiece 80 may be transmitted to the input/output device 510 such as by a display device 514 which may display a computer simulation of the workpiece model 92 predicted distortion and/or predicted residual stress in the workpiece 80. The predicted distortion and/or predicted residual stress may be displayed on the display device 514 as a graphical display and/or as numerical values representative of the magnitude and/or direction of the distortion and/or residual stress relative to a reference point (not shown) of the workpiece model 92 (FIG. 18B). However, the output of the stress function applicator 530 may be by any suitable means and is not limited to graphical or numerical display on the display device 514.

In an embodiment, the processor-based system 500 may include one or more of the processors 204 for executing instructions of computable readable program instructions 524 that may be installed into the memory device 506. Alternatively, the processor 504 may comprise a multi-processor core having two or more integrated processors cores. Even further, the processor 504 may comprise a main processor and one or more secondary processors integrated on a chip. The processor 504 may also comprise a many-processor system having a plurality of similarly configured processors.

Referring still to FIG. 19, the processor-based system 500 may further include one or more memory devices 506 which may comprise one or more of volatile or non-volatile storage devices 508. However, the memory device 506 may comprise any hardware device for storing data. For example, the memory device 506 may comprise a random access memory or a cache of an interface and/or integrated memory controller hub which may be included in the communication path 202. The memory device 506 may be configured to permanently and/or temporarily store any one of a variety of different types of data, computer readable code or program instructions 524, or any other type of information. The non-volatile storage device 508 may be provided in a variety of configurations including, but not limited to, a flash memory device, a hard drive, an optical disk, a hard disk, a magnetic tape or any other suitable embodiment for long-term storage. In addition, the non-volatile storage device 508 may comprise a removable device such as a removable hard drive.

The processor-based system 500 may additionally include one or more of the input/output devices 510 to facilitate the transfer of data between components that may be connected to the processor-based system 500. The input/output device 510 may be directly and/or indirectly coupled to the processor-based system 500. The input/output device 510 may facilitate user-input by means of a peripheral device such as a keyboard, a mouse, a joystick, a touch screen and any other suitable device for inputting data to the processor-based system 500. The input/output device 510 may further include an output device for transferring data representative of the output of the processor-based system 500. For example the input/output device 510 may comprise a display device 514 such as a computer monitor or computer screen for displaying results of data processed by the processor-based system 500. The input/output device 510 may optionally include a printer or fax machine for printing a hardcopy of information processed by the processor-based system 500.

Referring still to FIG. 19, the processor-based system 500 may include one or more communications devices 512 to facilitate communication of the processor-based system 500 within a computer network and/or with other processor-based systems. Communication of the processor-based system 500 with a computer network or with other processor-based systems may be by wireless means and/or by hardwire connection. For example, the communications device 512 may comprise a network interface controller to enable wireless or cable communication between the processor-based system 500 and a computer network. The communications device 512 may also comprise a modem and/or a network adapter or any one of a variety of alternative device for transmitting and receiving data.

One or more of the operations of the methodology described above for predicting and/or validating residual stress 18 (FIG. 2) in a workpiece 80 (FIG. 18A) may be performed by the processor 504 and/or by one or more of the coefficient calculator 526, the stress function calibrator 528, the stress function applicator 530, the distortion predictor 532, and the stress measurement fitting device 534 using the computer readable program instructions 524. The computer readable program instructions 524 may comprise program code which may include computer usable program code and computer readable program code. The computer readable program instructions 524 may be read and executed by the processor 504. The computer readable program instructions 524 may enable the processor 504 to perform one or more operations of the above-described embodiments associated with predicting residual stress 18 (FIG. 2) and distortion (FIGS. 13, 15) in a workpiece 80 (FIG. 18A).

Referring still to FIG. 19, the computer readable program instructions 524 may include operating instructions for the processor-based system 500 and may further include applications and programs. The computer readable program instructions 524 may be contained and/or loaded onto one or more of memory devices 506 and/or non-volatile storage devices 508 for execution by the processor 504 and/or by the coefficient calculator 526, the stress function calibrator 528, the stress function applicator 530, the distortion predictor 532, and the stress measurement fitting device 534. As indicated above, one or more of the memory devices 506 and/or non-volatile storage devices 508 may be communicatively coupled to one or more of the remaining components illustrated in FIG. 19 through the communication path 202.

The computer readable program instructions 524 may be contained on tangible or non-tangible, transitory or non-transitory computer readable media 518 and which may be loaded onto or transferred to the processor-based system 500 for execution by the processor 504. The computer readable program instructions 524 and the computer readable media 518 comprise a computer program product 516. In an embodiment, the computer readable media 518 may comprise computer readable storage media 520 and/or computer readable signal media 522.

The computer readable storage media 520 may comprise a variety of different embodiments including, but not limited to, optical disks and magnetic disks that may be loaded into a drive, a flash memory device or other storage device or hardware for transfer of data onto a storage device such as a hard drive. The computer readable storage media 520 may be non-removably installed on the processor-based system 500. The computer readable storage media 520 may comprise any suitable storage media and may include, without limitation, a semiconductor system or a propagation medium. In this regard, the computer readable storage media 520 may comprise electronic media, magnetic media, optical media, electromagnetic media, and infrared media. For example, the computer readable storage media 520 may comprise magnetic tape, a computer diskette, random access memory and read-only memory. Non-limiting examples of embodiments of optical disks may include compact disks—read only memory, compact disks—read/write, and digital video disks.

The computer readable signal media 522 may contain the computer readable program instructions 524 and may be embodied in a variety of data signal configurations including, but not limited to, an electromagnetic signal and an optical signal. Such data signals may be transmitted by any suitable communications link including by wireless or hardwire means. For example, the hardwire means may comprise an optical fiber cable, a coaxial cable, a signal wire and any other suitable means for transmitting the data by wireless or by physical means.

Referring still to FIG. 19, the computer readable signal media 522 may facilitate the downloading of the computer readable program instructions 524 to the non-volatile storage or other suitable storage or memory device for use within processor-based system 500. For example, the computer readable program instructions 524 contained within the computer readable storage media 520 may be downloaded to the processor-based system 500 over a computer network from a server or client computer of another system.

Any one of a variety of different embodiments of the processor-based system 500 may be implemented using any hardware device or system capable of executing the computer readable program instructions 524. For example, the processor 504 may comprise a hardware unit configured for performing one or more particular functions wherein the computer readable program instructions 524 for performing the functions may be pre-loaded into the memory device 506.

In an embodiment, the processor 504 may comprise an application specific integrated circuit (ASIC), a programmable logic device, or any other hardware device configured to perform one or more specific functions or operations. For example, a programmable logic device may be temporarily or permanently programmed to perform one or more of the operations related to the methodology of predicting residual stress 18 (FIG. 2) or distortion (FIGS. 13, 15) in a workpiece 80 (FIG. 18A) due to a selected manufacturing operation 108 (FIG. 1D). The programmable logic device may comprise a programmable logic array, programmable array logic, a field programmable logic array, and a field programmable gate array and any other suitable logic device, without limitation. In an embodiment, the computer readable program instructions 524 may be operated by the one or more processor 504 and/or by other devices including one or more hardware units in communication with the processor 504. Certain portions of the computer readable program instructions 524 may be the processor 504 and other portions of the computer readable program instructions 524 may be run by the hardware units.

Advantageously, the various embodiments described above provide the ability to predict residual stress 18 (FIG. 2) and distortion (FIGS. 13, 15) that may occur in a workpiece 80 (FIG. 18A) with the further technical effect of obviating the need to manufacture a physical workpiece 80 in order to determine the residual stress 18 that may occur in the workpiece 80 as a result of performing a selected manufacturing operation on the workpiece 80. In this regard, the technical effect of performing one or more operations of the above-described methodology include the elimination of the need to iteratively adjust the manufacturing parameters, fabricate a new workpiece 80, measure the residual stress 18 in the new workpiece 80, and then re-adjust the manufacturing parameters until the residual stress 18 and/or the distortion (FIGS. 13, 15) falls within acceptable limits. Furthermore, the various advantageous embodiments described above provide the technical effect of increasing the efficiency and accuracy in validating predictions of residual stress 18 that may occur in a workpiece 80 as a result of the performance of a selected manufacturing operation on the workpiece 80.

Additional modifications and improvements of the present disclosure may be apparent to those of ordinary skill in the art. Thus, the particular combination of parts described and illustrated herein is intended to represent only certain embodiments of the present disclosure and is not intended to serve as limitations of alternative embodiments or devices within the spirit and scope of the disclosure.

What is claimed is:

1. A method of predicting workpiece distortion resulting from a selected manufacturing operation, comprising the steps of:
   measuring through-thickness residual stress in a coupon surface of a plate coupon along an in-plane direction of the coupon surface, the through-thickness residual stress being induced in the coupon surface in response to a selected manufacturing operation applied to the plate coupon;
   calculating a moment coefficient for the in-plane direction, the moment coefficient being representative of residual stress induced in the plate coupon by the selected manufacturing operation;
   calibrating a stress function to the moment coefficient;
   applying the calibrated stress function to a model of the workpiece; and
   computing, using a processor, predicted distortion of the workpiece resulting from application of the calibrated stress function to the workpiece model.

2. The method of claim 1 further comprising the step of:
   fitting the induced residual stress measurements to a curve shape function.

3. The method of claim 2 wherein:
   the curve shape function is a polynomial function $\phi_k$ defined by the following equation:

$$\phi_k = \left(\frac{z-z_0}{z_0}\right)^{k+2}$$

the step of calculating the moment coefficient $C_M$ is performed using the following equation:

$$C_M = \sum_{k=1}^{N} A_k \int_0^{z_0} \left(\frac{z-z_0}{z_0}\right)^{k+2} \left(z - \frac{t}{2}\right) dz$$

wherein:
   N represents the quantity of curve shape functions for k=1 to N;
   $A_k$ represents a constant coefficient for multiplying the corresponding curve shape function;
   t represents depth of the plate coupon along which the residual stress is integrated;
   z represents variable depth within the plate coupon;
   $z_0$ represents a maximum depth of measurement of the induced residual stress.

4. The method of claim 2 wherein the step of calculating the moment coefficient $C_M$ includes:
   applying the fitted induced residual stress measurements to a model of the plate coupon;
   extracting measurements of displacement of the coupon surface resulting from the application of the fitted induced residual stress measurements to the plate coupon model;
   fitting the coupon displacement measurements to a displacement shape function; and
   calculating the moment coefficient $C_M$ using the following equation:

$$C_M = \frac{A_l t_c^3}{12}$$

wherein:
$A_l$ represents a fitted coefficient of the displacement shape function in at least one of the x, y and xy-directions;
$t_c$ represents the coupon thickness.

5. The method of claim 2 wherein the step of calculating the moment coefficient includes:
  physically measuring displacement of the coupon surface;
  fitting the coupon displacement measurements to a displacement shape function; and
  calculating the moment coefficient based upon the displacement shape function.

6. The method of claim 2 wherein the step of calibrating the stress function to the moment coefficient comprises:
  fixing a depth term of the stress function to be less than the depth at which the induced residual stress measurements diminish to zero in the plate coupon;
  equating a moment of the stress function to the moment coefficient; and
  solving for a stress magnitude term of the stress function.

7. The method of claim 6 wherein:
  the stress function comprises a step function having a magnitude $S_{max}$ and a depth d;
  the stress magnitude $S_{max}$ being calculated by fixing the depth d and solving the following equation:

$$S_{max} = \frac{2C_M}{d(d-t_c)}$$

wherein:
$C_M$ represents the moment coefficient;
d represents the depth along which the stress magnitude $S_{max}$ acts;
$t_c$ represents a thickness of the plate coupon.

8. The method of claim 6 wherein:
  the stress function comprises a $3^{rd}$ order term function having a stress magnitude A and a depth $z_0$;
  the stress magnitude A being calculated by fixing the depth $z_0$ and solving the following equation:

$$A = \frac{C_M}{\frac{z_0 t_c}{8} - \frac{(z_0)^2}{20}}$$

wherein:
$C_M$ represents the moment coefficient;
$z_0$ represents the depth along which the stress magnitude A acts;
$t_c$ represents a thickness of the plate coupon.

9. A method of predicting distortion in a workpiece processed using a selected manufacturing operation, comprising the steps of:
  applying the selected manufacturing operation to a coupon surface of a plate coupon;
  measuring residual stress induced in the coupon surface;
  fitting the induced residual stress measurements to a curve shape function;
  calculating a moment coefficient of the fitted induced residual stress measurements;
  calibrating a stress function to the moment coefficient by performing the following:
  fixing a depth term of the stress function to be less than the depth at which the induced residual stress measurements diminish to zero in the plate coupon;
  equating a moment of the stress function to the moment coefficient;
  solving for a stress magnitude term of the stress function;
  applying the calibrated stress function at the stress magnitude to a model of the workpiece; and
  computing at least one of predicted distortion and predicted residual stress in the workpiece resulting from application of the calibrated stress function to the model.

10. The method of claim 9 wherein:
  the curve shape function is a polynomial function $\phi_k$ defined by the following equation:

$$\phi_k = \left(\frac{z - z_0}{z_0}\right)^{k+2}$$

the step of calculating the moment coefficient $C_M$ is performed using the following equation:

$$C_M = \sum_{k=1}^{N} A_k \int_0^{z_0} \left(\frac{z-z_0}{z_0}\right)^{k+2} \left(z - \frac{t}{2}\right) dz$$

wherein:
N represents the quantity of curve shape functions for k=1 to N;
$A_k$ represents a constant coefficient for multiplying the corresponding curve shape function;
t represents depth of the plate coupon along which the residual stress is integrated;
z represents variable depth within the plate coupon;
$z_0$ represents a maximum depth of measurement of the induced residual stress.

11. The method of claim 9 wherein the step of calculating the moment coefficient $C_M$ includes:
  applying the fitted induced residual stress measurements to a model of the plate coupon;
  extracting measurements of displacement of the coupon surface resulting from the application of the fitted induced residual stress measurements to the plate coupon model;
  fitting the coupon displacement measurements to a displacement shape function; and
  calculating the moment coefficient $C_M$ using the following equation:

$$C_M = \frac{A_l t_c^3}{12}$$

wherein:
$A_l$ represents a fitted coefficient of the displacement shape function in at least one of the x, y and xy-directions;
$t_c$ represents the coupon thickness.

12. The method of claim 9 wherein the step of calibrating the stress function to the moment coefficient comprises:
  fixing a depth term of the stress function to be less than the depth at which the induced residual stress measurements diminish to zero in the plate coupon;

equating a moment of the stress function to the moment coefficient; and solving for a stress magnitude term of the stress function.

13. The method of claim 12 wherein:

the stress function comprises a step function having a magnitude $S_{max}$ and a depth d;

the stress magnitude $S_{max}$ being calculated by fixing the depth d and solving the following equation:

$$S_{max} = \frac{2C_M}{d(d-t_c)}$$

wherein:

$C_M$ represents the moment coefficient;

d represents the depth along which the stress magnitude $S_{max}$ acts;

$t_c$ represents a thickness of the plate coupon.

14. The method of claim 12 wherein:

the stress function comprises a $3^{rd}$ order term function having a stress magnitude A and a depth $z_0$;

the stress magnitude A being calculated by fixing the depth $z_0$ and solving the following equation:

$$A = \frac{C_M}{\frac{z_0 t_c}{8} - \frac{(z_0)^2}{20}}$$

wherein:

$C_M$ represents the moment coefficient;

$z_0$ represents the depth along which the stress magnitude A acts;

$t_c$ represents a thickness of the plate coupon.

15. A processor-based system for predicting distortion in a workpiece manufactured using a selected manufacturing operation, comprising:

a coefficient calculator for calculating a moment coefficient representative of through-thickness residual stress in a coupon surface of a plate coupon along an in-plane direction of the coupon surface, the through-thickness residual stress being induced in the plate coupon by a selected manufacturing operation applied to the plate coupon;

a stress function calibrator for calibrating a stress function to the moment coefficient;

a stress function applicator for applying the calibrated stress function to a model of the workpiece; and a distortion predictor for computing predicted distortion of the workpiece resulting from application of the calibrated stress function to the workpiece model.

16. The processor-based system of claim 15 further comprising:

a stress measurement fitting device for fitting induced residual stress measurements to a curve shape function, the induced residual stress measurements being representative of residual stress induced in a coupon surface of the plate coupon.

17. The processor-based system of claim 16 wherein:

the curve shape function is a polynomial function $\phi_k$ defined by the following equation:

$$\phi_k = \left(\frac{z-z_0}{z_0}\right)^{k+2}$$

the moment coefficient $C_M$ being calculated using the following equation:

$$C_M = \sum_{k=1}^{N} A_k \int_0^{z_0} \left(\frac{z-z_0}{z_0}\right)^{k+2}\left(z - \frac{t}{2}\right)dz$$

wherein:

N represents the quantity of curve shape functions for k=1 to N;

$A_k$ represents a constant coefficient for multiplying the corresponding curve shape function;

t represents depth of the plate coupon along which the residual stress is integrated;

z represents variable depth within the plate coupon;

$z_0$ represents a maximum depth of measurement of the induced residual stress.

18. The processor-based system of claim 16 wherein the stress function calibrator calibrates the stress function to the moment coefficient by:

setting a depth term of the stress function to be less than the depth at which the induced residual stress measurements diminish to zero in the plate coupon;

equating a moment of the stress function to the moment coefficient; and solving for a stress magnitude term of the stress function.

19. The processor-based system of claim 18 wherein:

the stress function comprises a step function having a magnitude $S_{max}$ and a depth d;

the stress magnitude $S_{max}$ being calculated by fixing the depth d and solving the following equation:

$$S_{max} = \frac{2C_M}{d(d-t_c)}$$

wherein:

$C_M$ represents the moment coefficient;

d represents the depth along which the stress magnitude $S_{max}$ acts;

$t_c$ represents a thickness of the plate coupon.

20. The processor-based system of claim 18 wherein:

the stress function comprises a $3^{rd}$ order term function having a stress magnitude A and a depth $z_0$;

the stress magnitude A being calculated by fixing the depth $z_0$ and solving the following equation:

$$A = \frac{C_M}{\frac{z_0 t}{8} - \frac{(z_0)^2}{20}}$$

wherein:

$C_M$ represents the moment coefficient;

$z_0$ represents the depth along which the stress magnitude A acts;

$t_c$ represents a thickness of the plate coupon.

* * * * *